(12) United States Patent
Kumagai

(10) Patent No.: US 7,695,759 B2
(45) Date of Patent: Apr. 13, 2010

(54) DISPLAY DEVICE AND MANUFACTURING METHOD THEREOF

(75) Inventor: Minoru Kumagai, Tokyo (JP)

(73) Assignee: Casio Computer Co., Ltd., Tokyo (JP)

( * ) Notice: Subject to any disclaimer, the term of this patent is extended or adjusted under 35 U.S.C. 154(b) by 442 days.

(21) Appl. No.: 11/800,842

(22) Filed: May 8, 2007

(65) Prior Publication Data
US 2007/0263164 A1  Nov. 15, 2007

(30) Foreign Application Priority Data
May 10, 2006  (JP) .............................. 2006-131002

(51) Int. Cl.
*B05D 5/06* (2006.01)
(52) U.S. Cl. ...................... 427/66; 427/421.1; 427/539; 427/553
(58) Field of Classification Search ................... 427/66, 427/421.1, 539, 553
See application file for complete search history.

(56) References Cited

U.S. PATENT DOCUMENTS

2002/0109456 A1* 8/2002 Morii et al. ................. 313/504
2003/0190419 A1* 10/2003 Katagami et al. ........... 427/240
2004/0174469 A1* 9/2004 Takagi et al. .................. 349/57

FOREIGN PATENT DOCUMENTS

JP   2001-042313   *  2/2001
JP   2001-76881 A    3/2001

* cited by examiner

*Primary Examiner*—Timothy H Meeks
*Assistant Examiner*—Jimmy Lin
(74) *Attorney, Agent, or Firm*—Frishauf, Holtz, Goodman & Chick, P.C.

(57) ABSTRACT

A bank for defining the regions in which pixels are formed has a stacked structure including: a base layer on the low level which also serves as an interlayer insulating film between the pixel forming regions; a middle bank layer on the middle level which serves to improve the fixation of an organic compound material (i.e., improve the uniformity of the film thickness of a positive hole transporting layer and an electron-transporting light emitting layer) in forming an organic EL layer; and a bank metal layer on the upper level which is made of a conductive material and serves also as a common voltage line (cathode line).

6 Claims, 16 Drawing Sheets

※ IN DRAWING, PARENTHESIZED NUMERALS INDICATE VERTICAL ORDERS OF LAYERS. LARGER NUMERALS INDICATE UPPER LAYERS.

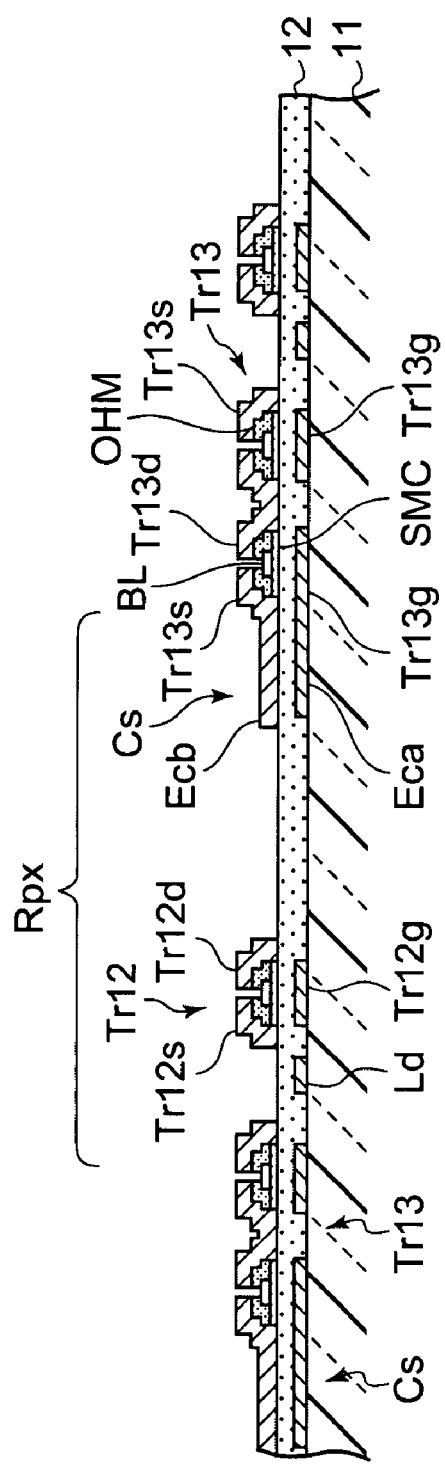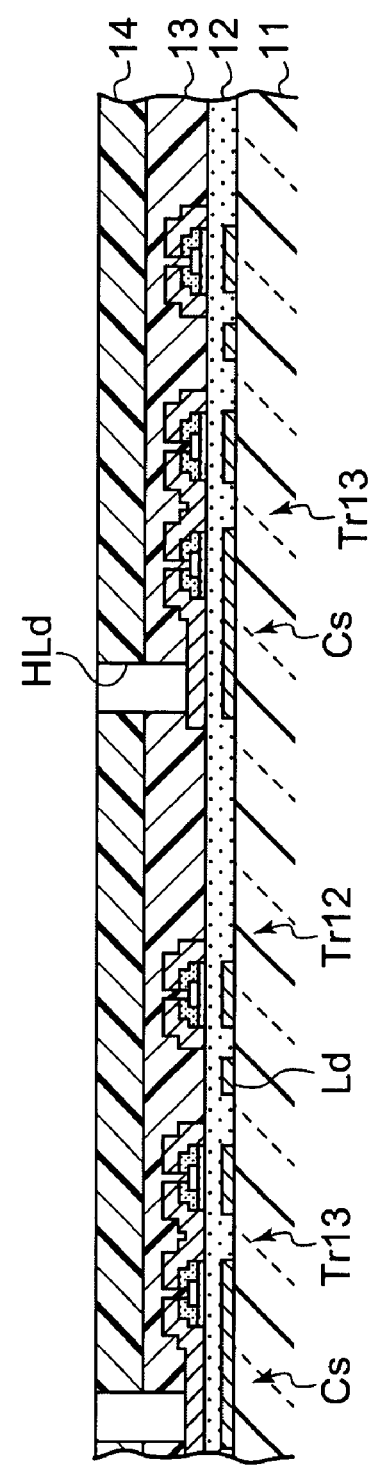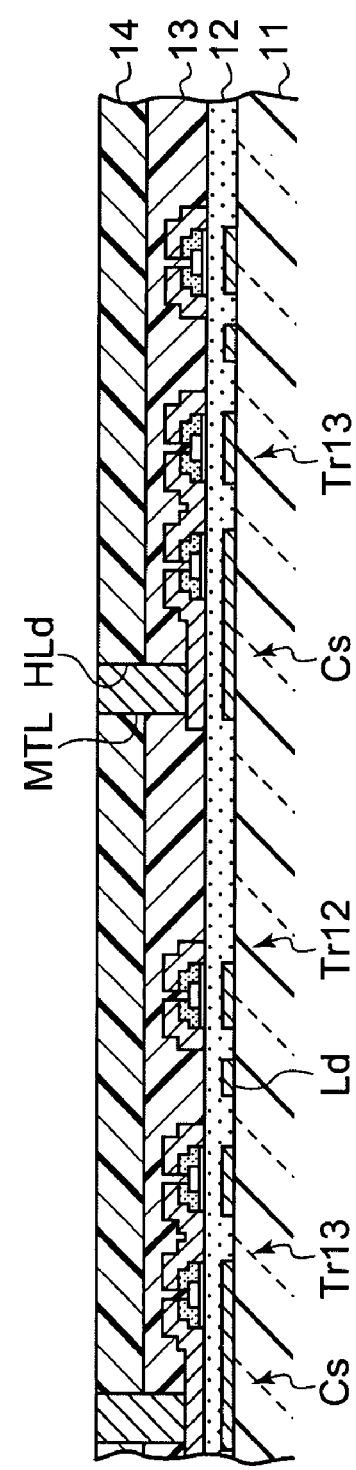

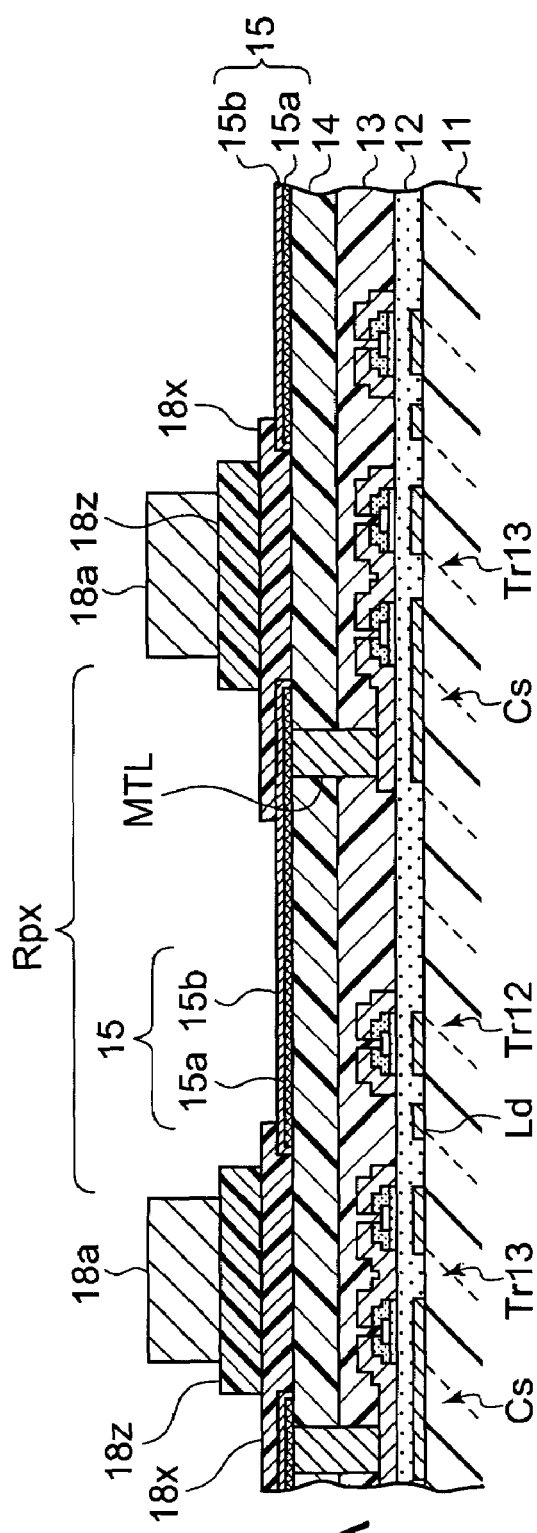
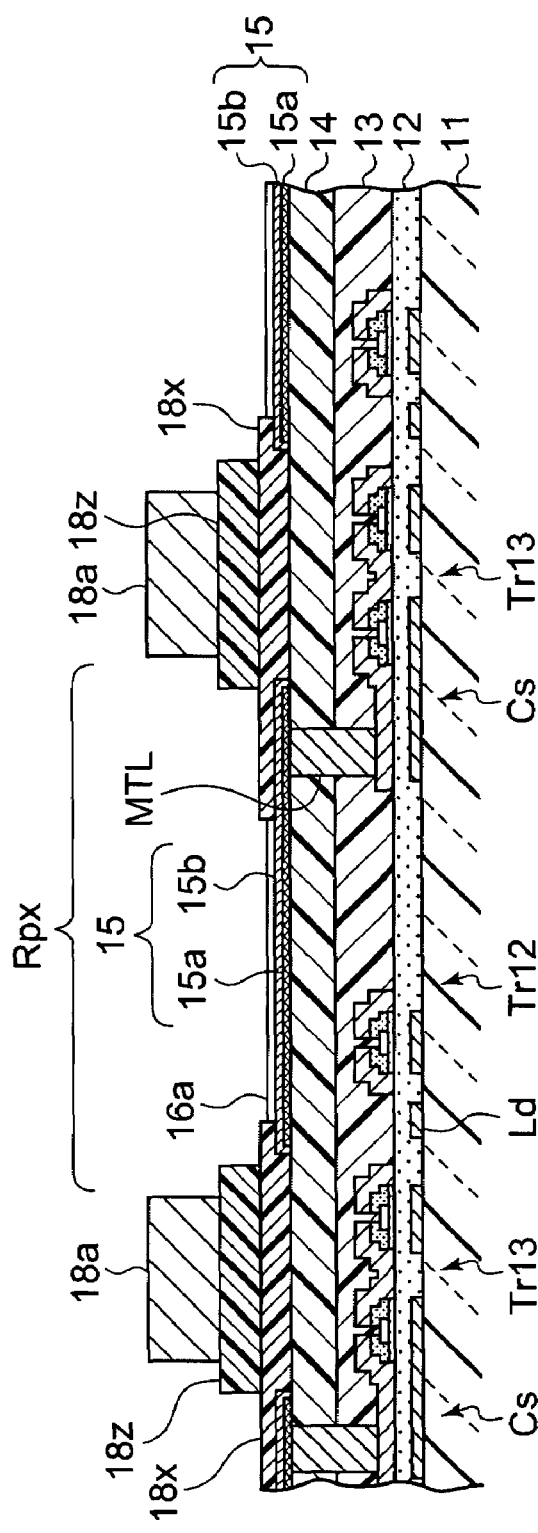
FIG. 9A
FIG. 9B

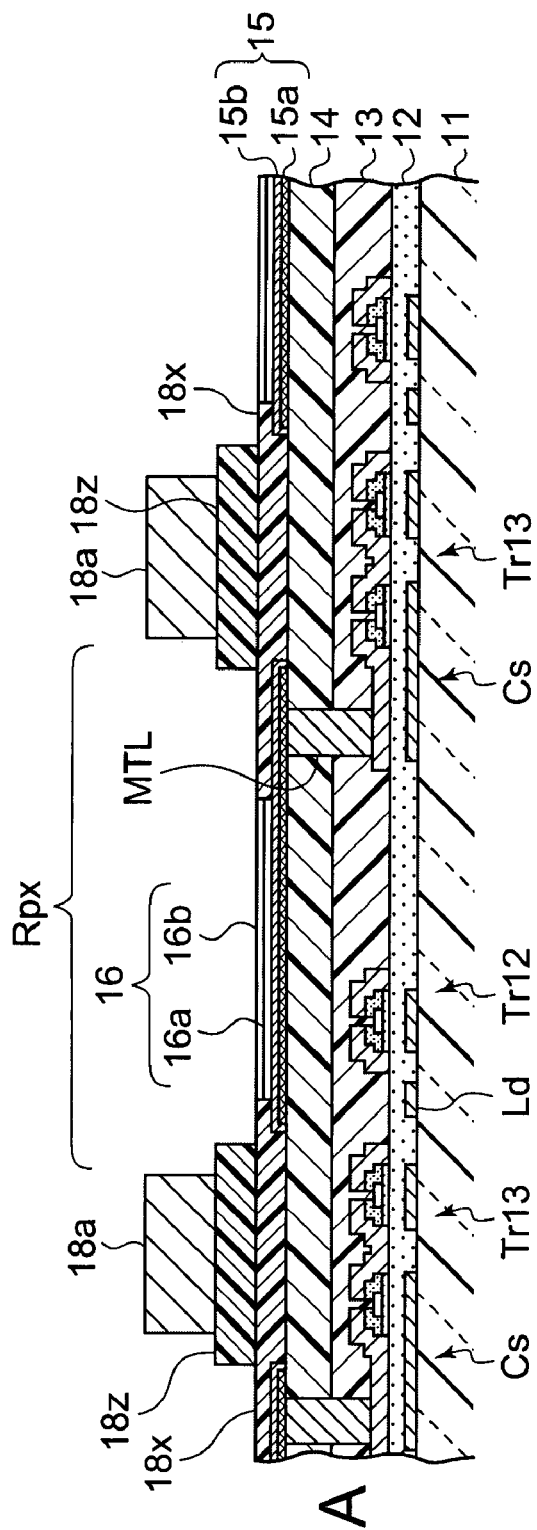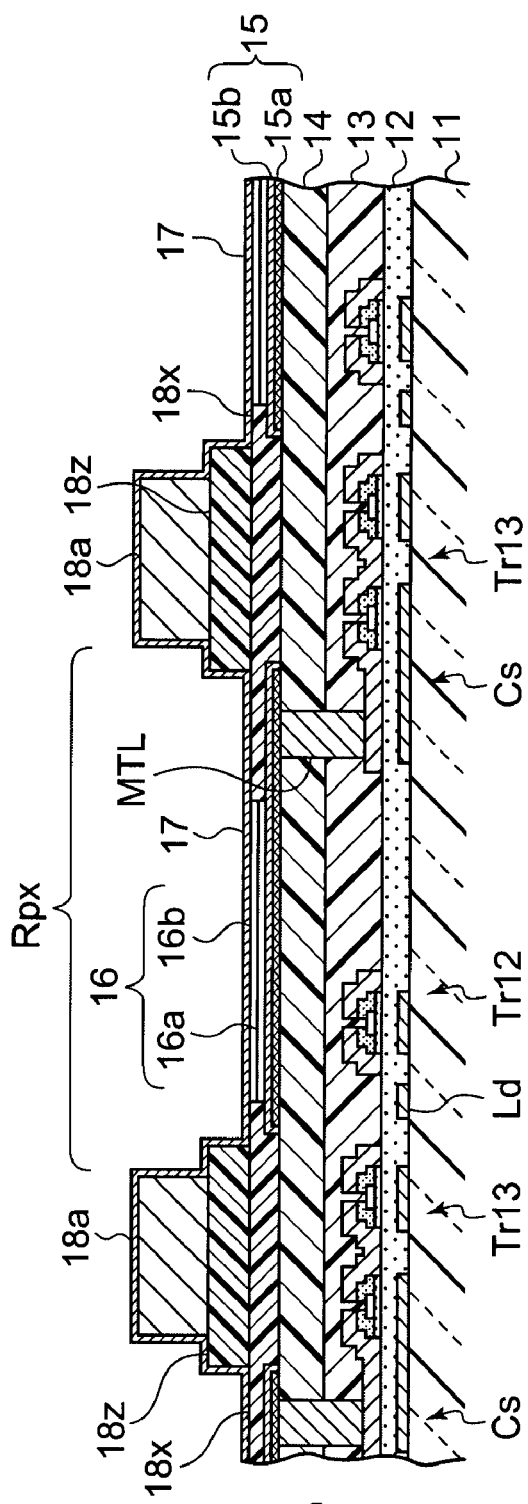

FLUORINE-BASED TRIAZINE-THIOL COMPOUND

DISPLAY DEVICE AND MANUFACTURING METHOD THEREOF

BACKGROUND OF THE INVENTION

1. Field of the Invention

The present invention relates to a display device and a manufacturing method thereof, and particularly, to a display device having a display panel on which a plurality of display pixels each having a light emitting element whose light emitting function layer is formed by coating a liquid material including a light emitting function material, are arrayed in two dimensions, and a manufacturing method thereof.

2. Description of the Related Art

Recently, as a display device of an electronic apparatus such as a portable telephone, a portable music player, etc., there is known a display device on which mounted is a display panel (organic EL display panel), on which organic electroluminescence elements (hereinafter abbreviated as "organic EL elements") are arrayed in two dimensions. Particularly, an organic EL display panel adapted to an active matrix drive system has extremely superior characteristics to liquid crystal display devices widely spread, in that the display response speed is high, there is no dependency on view angles, high luminance, high contrast, and high preciseness of the display quality, etc. are available, and a compact and light body can be obtained because no backlight or light guide plate is needed unlike a liquid crystal display device.

As well known, an organic EL element has an element structure formed of an anode (positive) electrode, an organic EL layer (light emitting function layer), and a cathode (negative) electrode which are sequentially stacked on one surface of a glass substrate or the like, and emits light (excitation light) based on the energy that is produced when holes and electrons injected into the organic EL layer are recombined in this layer, when a positive voltage is applied to the anode electrode and a negative voltage is applied to the cathode electrode in a manner that the organic EL layer exceeds a light emitting threshold. Organic EL elements are roughly classified into a low molecular type and a high molecular type, according to organic materials (positive hole transporting materials and electron-transporting light emitting materials) for forming a positive hole transporting layer (positive hole injecting layer) and an electron-transporting light emitting layer (light emitting layer), which make up the organic EL layer.

In a case where a low-molecular organic material is used, the manufacturing process of the organic EL element generally requires vapor deposition and therefore needs a mask in some case to prevent the low molecular material from being vapor-deposited on other areas than the anode electrode because it is necessary to selectively form a thin organic film of this low molecular type only on the anode electrode in a pixel forming region. Consequently, the low molecular material inevitably is deposited also on the surface of the mask, producing a great loss of material in the manufacturing process, making the manufacturing process inefficient.

On the other hand, in a case where a high-molecular organic material is used for the organic EL element, since an ink jetting method (liquid drop jetting method), a nozzle printing method (liquid flow jetting method), or the like can be used as a wet film forming method, the solution of the organic material can selectively be coated only on the anode electrode or a specific region including the anode electrode, providing a merit that a thin organic EL layer (a positive hole transporting layer and an electron-transporting light emitting layer) can be formed through an efficient manufacturing process with little material loss.

Further, some organic EL display panels of the high molecular type are known to have a panel structure with a continuous partitioning wall, which is formed to project upward from an insulating substrate such as a glass substrate or the like on which display pixels are arrayed and which is formed between pixel forming regions in which these display pixels are formed respectively, in order to define these pixel forming regions, and to prevent a phenomenon that light emitting colors are mixed beyond the respective display pixels with light emitting materials of different colors from adjoining pixel forming regions mixing into other regions when liquid materials made of high-molecular organic materials are coated. An organic EL display panel with such a partitioning wall is explained in, for example, Unexamined Japanese Patent Application KOKAI Publication No. 2001-76881.

SUMMARY OF THE INVENTION

An object of the present invention is to provide a display device having a display panel on which formed is a light emitting function layer (organic EL layer) having a uniform film thickness approximately all over the region where each display pixel is formed, and a manufacturing method of the display device.

To achieve the above object, a display device according to a first aspect of the present invention comprises:

a pixel electrode; and a partitioning wall which defines a pixel forming region by surrounding the pixel electrode, wherein the partitioning wall comprises at least:

a first insulating layer;

a second insulating layer which is lyophilic and formed on the first insulating layer; and a conductive layer which is liquid-repellent and formed on the second insulating layer.

To achieve the above object, a manufacturing method of a display device according a second aspect of the present invention comprises:

a step of forming a first insulating layer which surrounds a pixel electrode;

a step of forming a second insulating layer on the first insulating layer;

a step of forming a conductive layer on the second insulating layer;

a step of imparting lyophilicity to a surface of the pixel electrode and a surface of the second insulating layer;

a step of imparting liquid repellency to a surface of the conductive layer; and a step of coating a solution containing a charge transporting material on the pixel electrode.

BRIEF DESCRIPTION OF THE DRAWINGS

These objects and other objects and advantages of the present invention will become more apparent upon reading of the following detailed description and the accompanying drawings in which:

FIGS. 7A to 7C are cross-sectional diagrams of manufacturing steps (part 1) showing an example of a manufacturing method of the display device (display panel) according to the present embodiment;

FIGS. 9A and 9B are cross-sectional diagrams of manufacturing steps (part 3) showing an example of the manufacturing method of the display device (display panel) according to the present embodiment;

FIGS. 10A and 10B are cross-sectional diagrams of manufacturing steps (part 4) showing an example of the manufacturing method of the display device (display panel) according to the present embodiment;

DETAILED DESCRIPTION OF THE PREFERRED EMBODIMENT

A display device and a manufacturing method thereof according to the present invention will be explained below in detail, by showing an embodiment. In the embodiment described below, such a case will be explained, in which an organic EL element having an organic EL layer including a high-molecular organic material described above is used as the light emitting element to constitute each pixel.

(Display Panel)

First, a display panel and pixels to be used in the display device according to the present invention will be explained.

Figure 1:
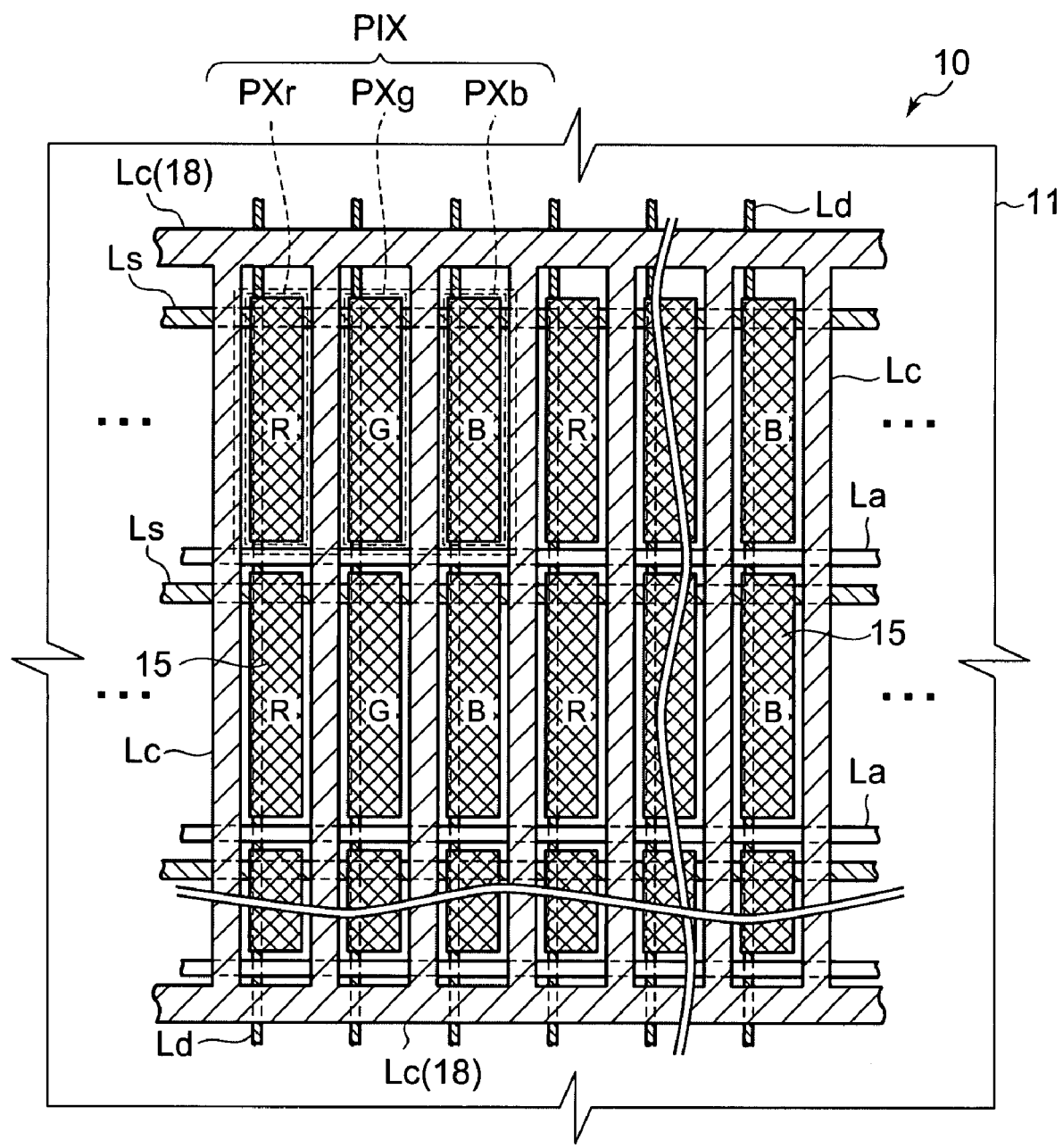
FIG. 1 is a schematic plan view showing an example of an array of pixels on a display panel used in a display device according to the present invention.
Figure 2:
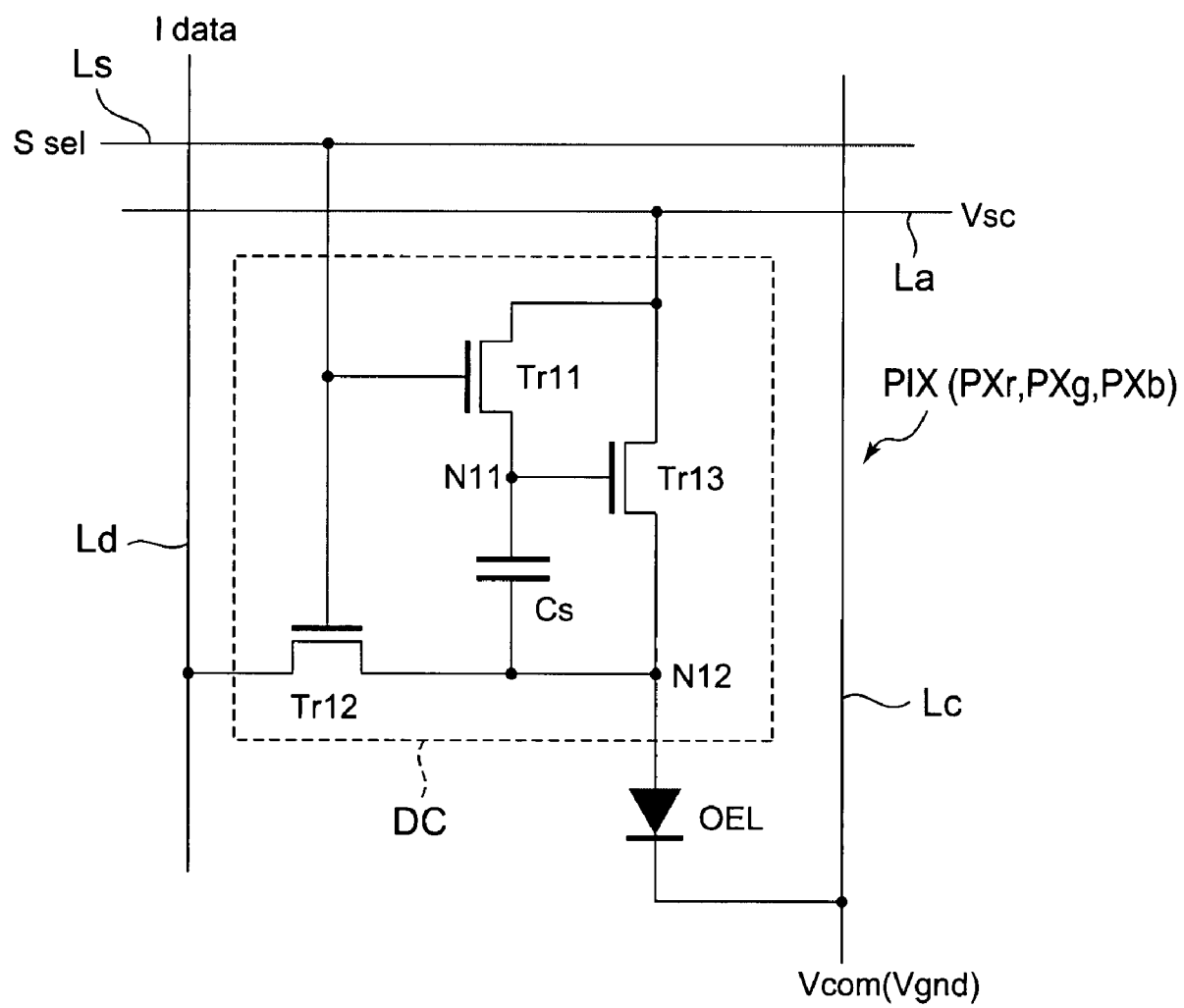
FIG. 2 is an equivalent circuit schematic showing an example of a circuit structure of each pixel (a display element and a pixel drive circuit) two-dimensionally arrayed on the display panel of the display device according to the present invention.

FIG. 1 is a schematic plan view showing an example of an array of pixels on the display panel used on the display device according to the present invention. FIG. 2 is an equivalent circuit schematic showing an example of a circuit structure of each pixel (a display element and a pixel drive circuit) to be two-dimensionally arrayed on the display panel of the display device according to the present invention. To facilitate understanding, the plan view of FIG. 1 only shows the relationship between the arrangement of pixel electrodes provided in the respective pixels (color pixels) and the allocation of wiring layers, as seen from the viewing side of the display panel (or an insulating substrate), and does not show transistors, etc. in the pixel drive circuit of FIG. 2 provided for each pixel. Further, FIG. 1 uses hatching for the sake of clarifying the arrangement of the pixel electrodes and wiring layers.

As shown in FIG. 1, the display device (display panel) according to the present invention has a plural number (a multiple of 3) of color pixels PXr, PXg, and PXb having three colors of red (R), green (G), and blue (B) arrayed on one surface of an insulating substrate 11 such as a glass substrate or the like repeatedly in the left and right direction of the drawing, while having a plural number of color pixels PXr, PXg, and PXb arrayed in the up and down direction of the drawing on the basis of a single color in each column. Here, adjoining color pixels PXr, PXg, and PXb having three colors of R, G, and B respectively form a group and constitute one display pixel PIX.

The display panel 10 has a common voltage line (for example, a cathode line) Lc, which is shaped like a bank (partitioning wall) having a fence-like or lattice-like planview pattern, projecting from one surface of the insulating substrate 11 to define color pixel regions each including a plurality of color pixels PXr, or color pixels PXg, or color pixels PXb of a single color arrayed in the up and down direction. The respective pixel forming regions, in which the plurality of color pixels PXr, or color pixels PXg, or color pixels PXb included in each color pixel region are formed respectively, are each provided with a pixel electrode (for example, an anode electrode) 15, and each have a data line Ld laid in the up and down direction (i.e., column direction) in parallel with the direction in which the common voltage line Lc is laid, and a selection line Ls and a supply voltage line (for example, an anode line) La laid in the left and right direction (i.e., ow direction) orthogonally to the data line Ld.

A specific circuit structure of each color pixel PXr, PXg, and PXb of each display pixel PIX is constituted by, as shown in, for example, FIG. 2, a pixel drive circuit (pixel circuit) DC formed on the insulating substrate 11 and comprising at least one transistor (e.g., an amorphous silicon thin film transistor or the like), and an organic EL element (display element) OEL which functions to emit light when a light emission drive current generated by the pixel drive circuit DC is supplied to the pixel electrode 15.

The supply voltage line La is connected directly or indirectly to, for example, a predetermined high-potential power source, and applies a predetermined high voltage (supply voltage Vsc) to the pixel electrodes 15 (e.g., anode electrodes) of the organic EL elements OEL provided in each display pixel PIX (color pixels PXr, PXg, and PXb) in order for a light emission drive current corresponding to display data (gradation current Idata) to flow in the pixel electrodes 15. The common voltage line Lc is connected directly or indirectly to, for example, an opposing electrode (e.g., a cathode electrode) of the organic EL elements OEL, and applies a predetermined low voltage (common voltage Vcom; e.g., a ground voltage Vgnd).

The pixel drive circuit DC comprises a transistor Tr11, a transistor Tr12, and a transistor Tr13 (switching elements for light emission drive purpose), and a capacitor Cs, as shown in, for example, FIG. 2. The transistor Tr11 has its gate terminal connected to the selection line Ls which is laid in the row direction of the display panel 10 (insulating substrate 11), has its drain terminal connected to the supply voltage line La, and has its source terminal connected to a node N11. The transistor Tr12 has its gate terminal connected to the selection line Ls, has its source terminal connected to the data line Ld which is laid in the column direction of the display panel 10, and has its drain terminal connected to a node N12. The transistor Tr13 has its gate terminal connected to the node N11, has its drain terminal connected to the supply voltage line La, and has its source terminal connected to the node N12. The capacitor Cs is connected between the node N11 and the node N12 (between the gate and source of the transistor Tr13). Here, the transistors Tr11 to Tr13 are all n channel type thin film transistors.

The organic EL element OEL has its anode terminal (pixel electrode 15 to serve as an anode electrode) connected to the node N12 of the pixel drive circuit DC, and has its cathode terminal (opposing electrode to serve as a cathode electrode) connected to the common voltage line Lc laid in the column direction of the display panel 10. Further, in FIG. 2, the capacitor Cs is a parasitic capacitor produced between the gate and source of the transistor Tr13, or an auxiliary capacitor additionally formed between the gate and source of the transistor Tr13.

(Device Structure of Pixel)

Next, a specific device structure (plan layout and cross-sectional structure) of the pixel (light emission drive circuit and organic EL element) having the circuit structure described above will be explained.

Figure 3:
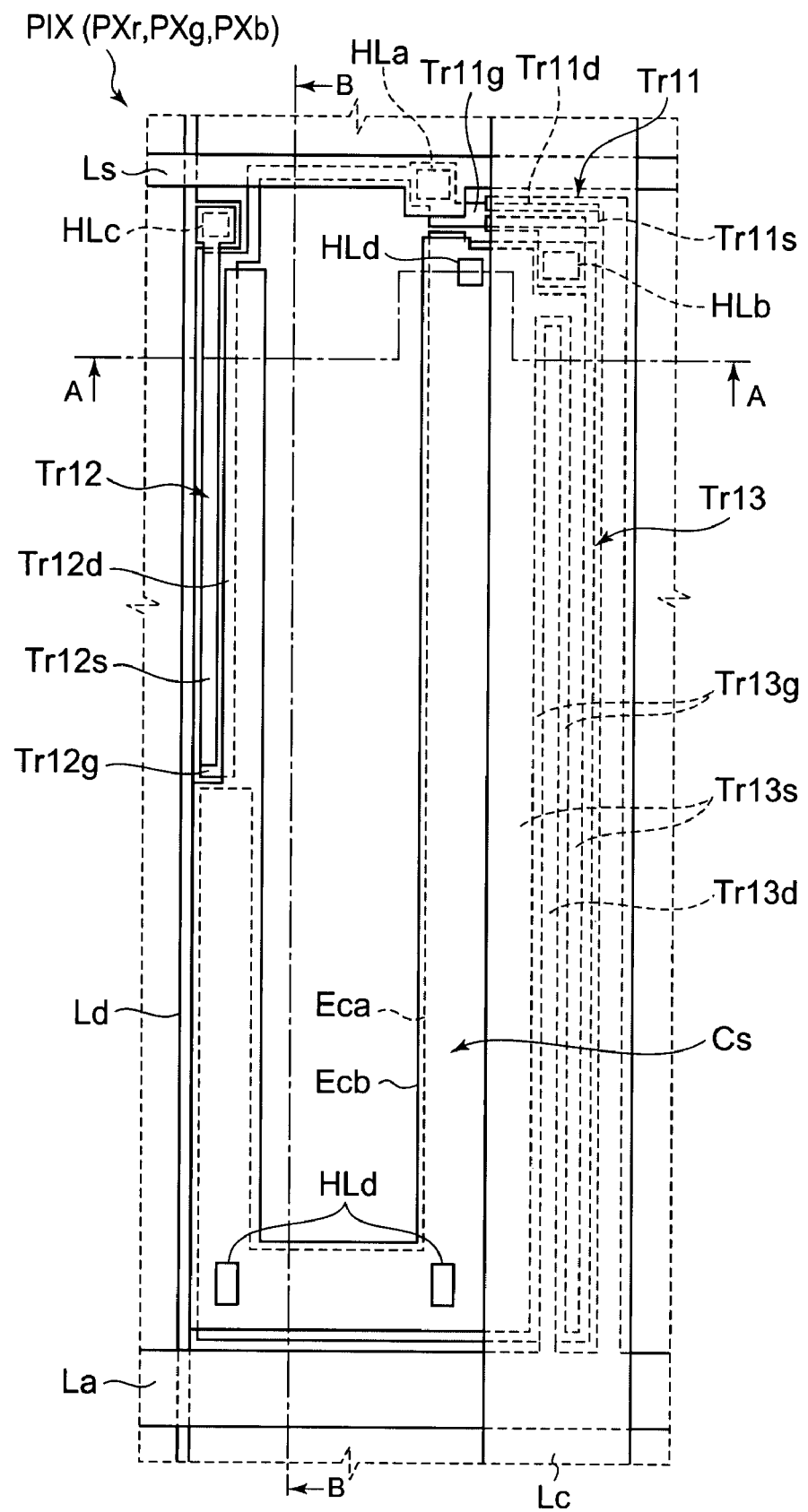
FIG. 3 is a plan layout diagram showing an example of a pixel applicable to the display device (display panel) according to an embodiment of the present invention.
Figure 4:
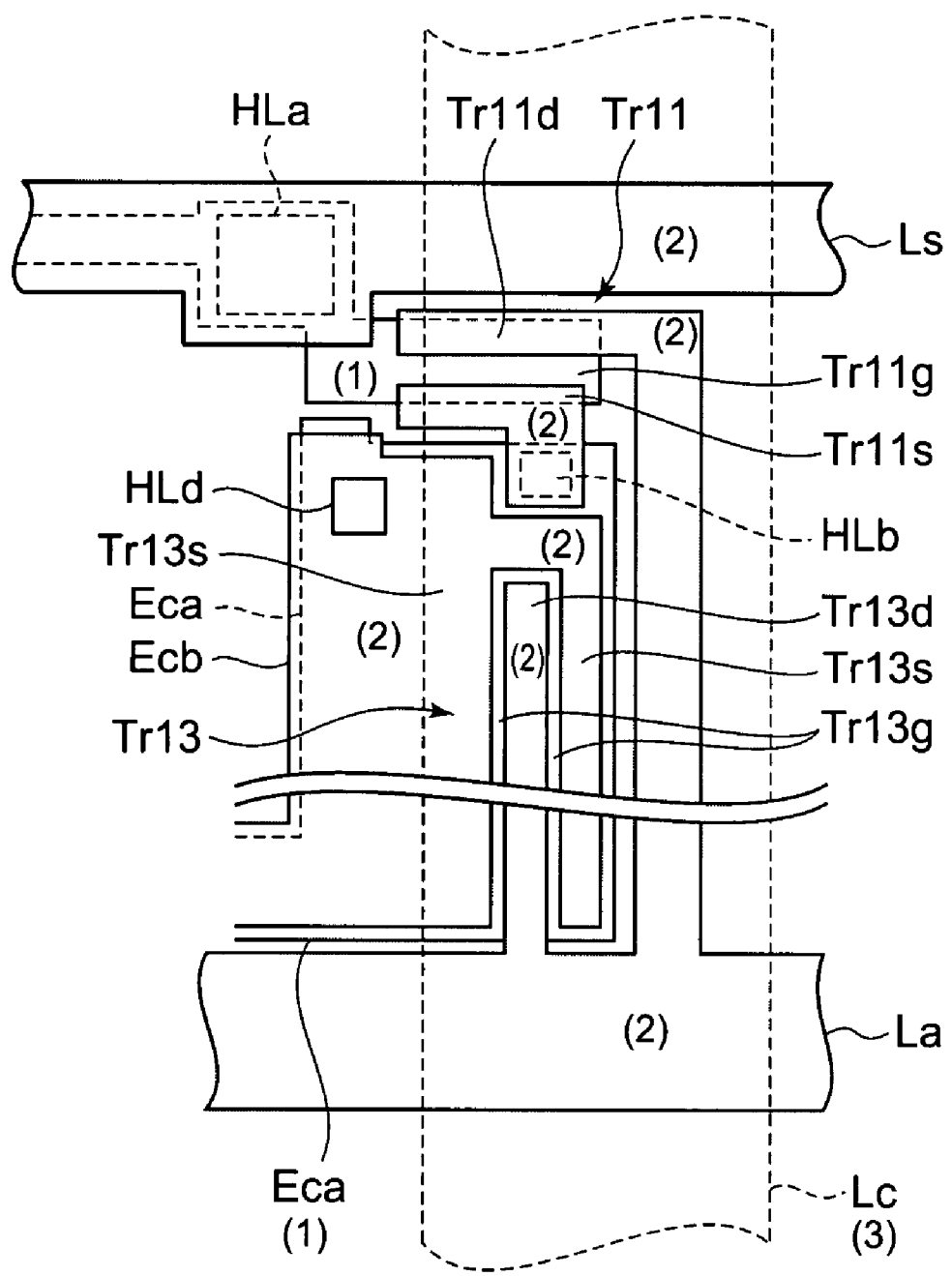
FIG. 4 is a diagram detailing a principal part of the plan layout of the pixel according to the present embodiment.
Figure 5:
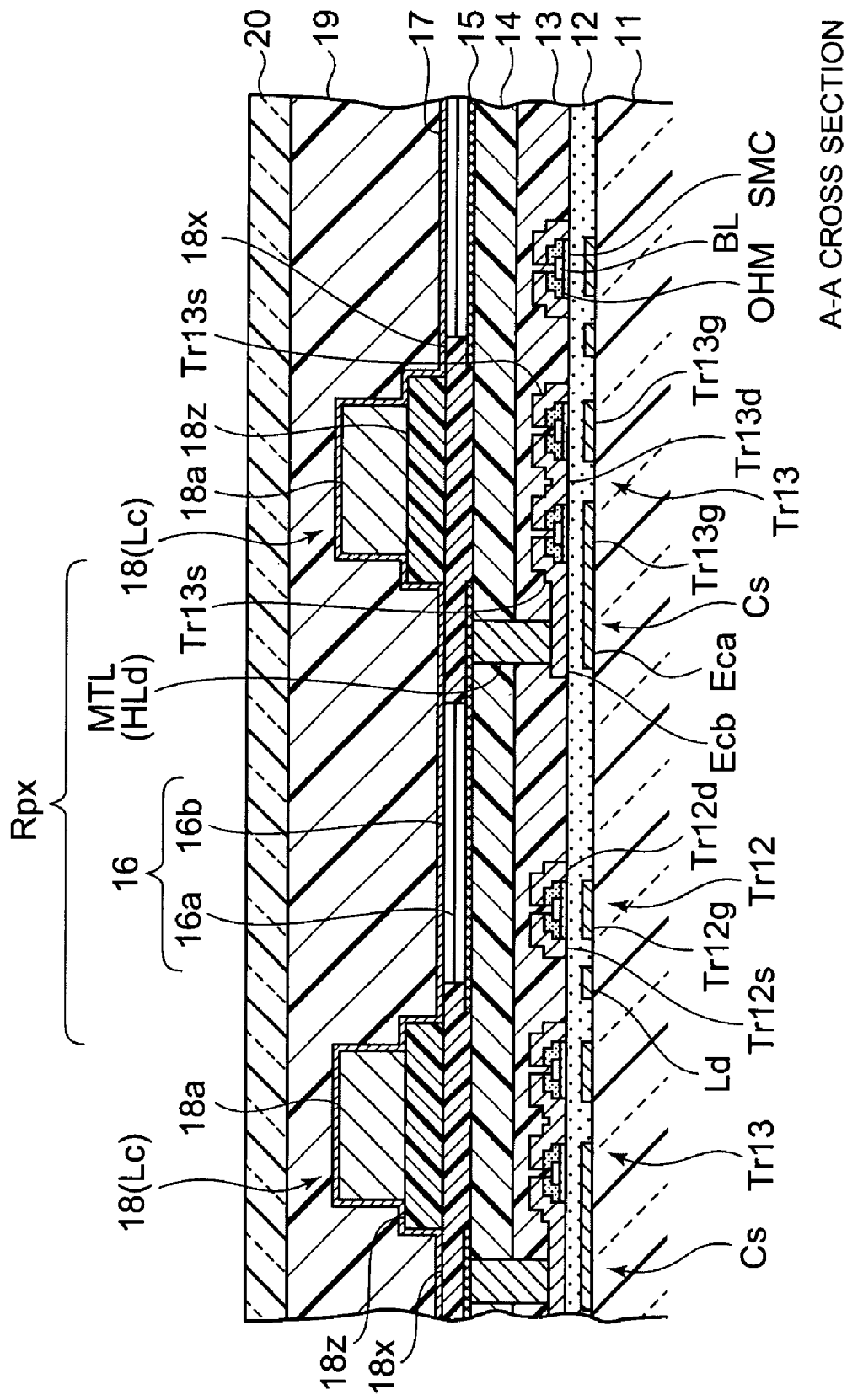
FIG. 5 is a schematic cross-sectional diagram of the pixel having the plan layout according to the preset embodiment, as sectioned along a line A-A of the play layout.
Figure 6:
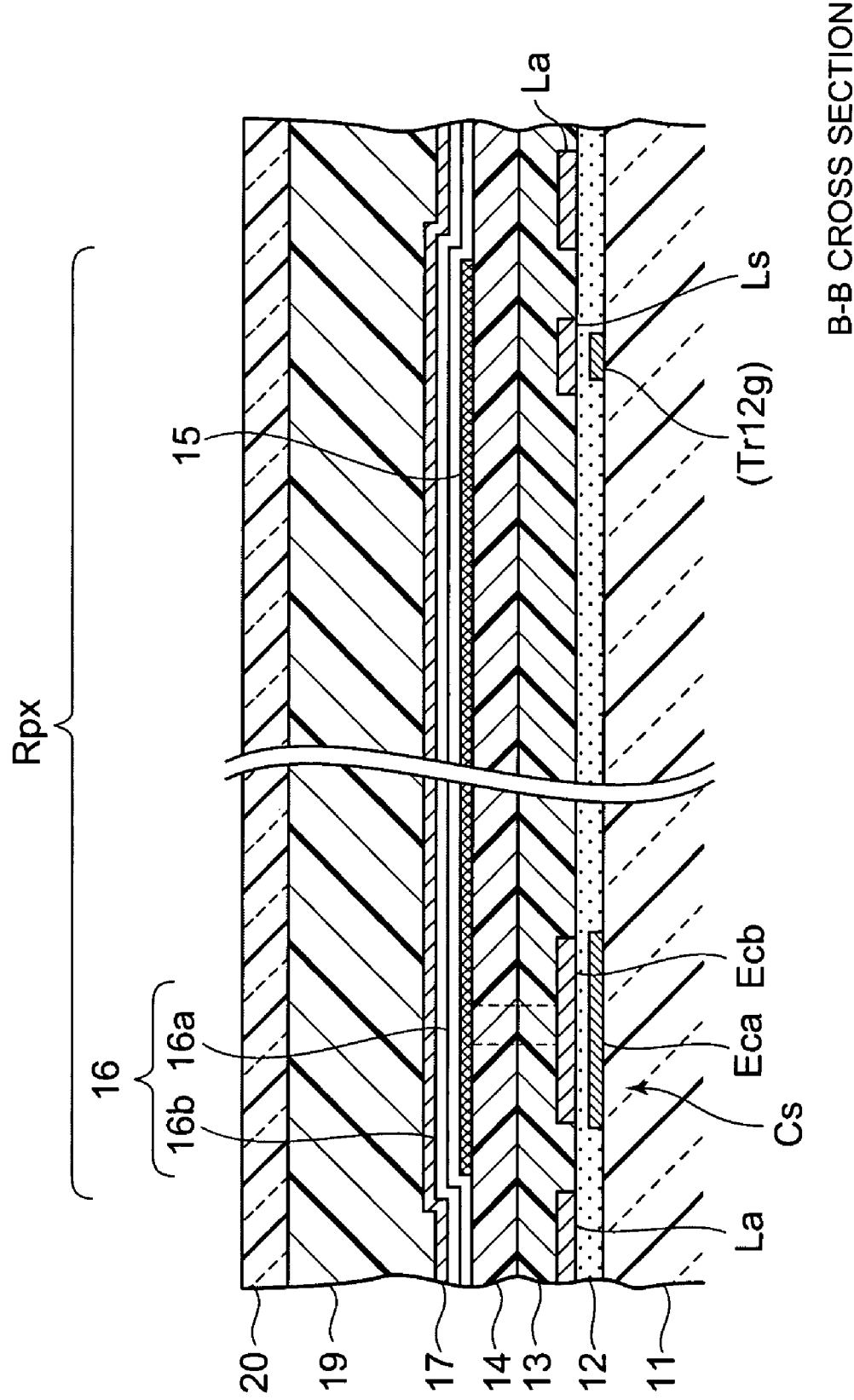
FIG. 6 is a schematic cross-sectional diagram of the pixel having the plan layout according to the preset embodiment, as sectioned along a line B-B of the plan layout.

FIG. 3 is a plan layout diagram showing an example of a pixel applicable to the display device (display panel) according to the present embodiment. FIG. 4 is a diagram detailing the principal part of the plan layout (FIG. 3) of the pixel according to the present embodiment. Here, a plan layout of one specific color pixel among the color pixels PXr, PXg, and PXb of red (R), green (G), and blue (B) of the display pixel PIX shown in FIG. 1 is shown. FIG. 3 mainly shows a layer on which the transistors of the pixel drive circuit DC, wiring layers, etc. are formed. FIG. 4 specifically shows a view of transistors, wiring layers, etc. that are formed on a lower layer than the common voltage line Lc, as cut out from the plan layout of FIG. 3. Parenthesized numerals of FIG. 4 indicate the vertical order of each conductive layer (including wiring layers), where the smaller the numeral is, the lower (the closer to the insulating substrate 11) the layer is, while the larger the numeral is, the upper (the closer to the viewing side) the layer is. In other words, in FIG. 4, the layer denoted as (1) is formed lower than the layer denoted as (2), and the layer denoted as (2) is formed lower than the layer denoted as (3). FIG. 5 and FIG. 6 are schematic cross-sectional diagrams of the display pixel PIX having the plan layout of FIG. 3, as sectioned along A-A and B-B respectively.

Specifically, the display pixel PIX (color pixels PXr, PXg, and PXb) shown in FIG. 2 includes pixel forming regions (regions where color pixels PXr, PXg, and PXb are formed respectively) Rpx defined on one surface of the insulating substrate 11, each of which pixel forming regions has a selection line Ls and a supply voltage line La laid so as to extend in the row direction (left and right direction of the drawing) in its upper and lower edge regions in the plan layout of FIG. 3, and has a data line Ld and a common voltage line Lc laid so as to extend in the column direction (up and down direction of the drawing) in its left an right edge regions in the plan layout of FIG. 3 so as to orthogonally cross the lines Ls and La. Here, as shown in FIG. 3 to FIG. 6, the supply voltage line La is formed lower (closer to the insulating substrate 11) than the common voltage line Lc, the selection line Ls and the supply voltage line La are formed level, and the data line Ld is formed lower than the selection line Ls and the supply voltage line La. The selection line Ls is formed in the same manufacturing step as forming the source and drain of the transistors Tr11 to Tr13, by patterning a source/drain metal layer for forming the source and drain. The data line Ld is formed in the same manufacturing step as forming the gate of the transistors Tr11 to Tr13, by patterning a gate metal layer for forming the gate.

That is, the display pixel PIX has the plurality of transistors Tr11 to Tr13 and capacitor Cs of the pixel drive circuit DC (see FIG. 2), which is formed in the display pixel PIX, and the various wiring layers including the selection line Ls and the data line Ld, all formed on the insulating substrate 11, as shown in FIG. 5 and FIG. 6. A protective insulating film 13 and a flattening film 14 are formed sequentially so as to cover the transistors Tr11 to Tr13 and the wiring layers. An organic EL element OEL, which includes: a pixel electrode (e.g., an anode electrode) 15 connected to the pixel drive circuit DC to be supplied with a predetermined light emission drive current; an organic EL layer (light emitting function layer) 16 including a positive hole transporting layer 16a (charge transporting layer) and an electron-transporting light emitting layer 16b (charge transporting layer); and an opposing electrode (e.g., a cathode electrode) 17 to which a common voltage Vcom is applied, is formed on an upper layer than the protective insulating film 13 and the flattening film 14.

In the pixel drive circuit DC, as more specifically shown in FIG. 3 and FIG. 4, the transistor Tr11 shown in FIG. 2 is disposed so as to extend along the selection line Ls laid in the row direction, the transistor Tr12 is disposed so as to extend along the data line Ld laid in the column direction, and the transistor Tr13 is disposed so as to extend along the common voltage line Lc laid in the column direction.

Each of the transistors Tr11 to Tr13 has the structure of a well-known field effect transistor, and comprises a gate electrode Tr11g, Tr12g, or Tr13g formed on the insulating substrate 11, a semiconductor layer SMC formed correspondingly to the gate electrode Tr11g, Tr12g, or Tr13g, and a source electrode Tr11s, Tr12s, or Tr13s and a drain electrode Tr11d, Tr12d, or Tr13d which are formed to extend from both ends of the semiconductor layer SMC.

A block layer BL made of silicon oxide, silicon nitride, or the like, which is for preventing any etching damage on the semiconductor layer SMC is formed on the semiconductor layer SMC, above which the source electrode and drain electrode of the transistors Tr11 to Tr13 face each other, and an impurity layer OHM for realizing ohmic connection between the semiconductor layer SMC and the source electrode or the drain electrode is formed on the semiconductor layer SMC at where the semiconductor layer SMC is contacted by the source electrode or the drain electrode. The gate electrodes Tr11g to Tr13g of the transistors Tr11 to Tr13 are all formed by patterning the same gate metal layer. The source electrodes Tr11s to Tr13s and drain electrodes Tr11d to Tr13d of the transistors Tr11 to Tr13 are all formed by patterning the same source/drain metal layer.

As shown in FIG. 3 and FIG. 4, the transistor Tr11 has its gate electrode Tr11g connected to the selection line Ls through a contact hole HLa opened in a gate insulating film 12, has its source electrode Tr11s connected to an electrode Eca of the capacitor Cs at one end thereof (closer to the node Ni11) through a contact hole HLb opened in the gate insulating film 12, and has its drain electrode Tr11d formed integrally with the supply voltage line La, so as to correspond to the circuit structure of the pixel drive circuit DC shown in FIG. 2.

As shown in FIG. 3 to FIG. 5, the transistor Tr12 has its gate electrode Tr12g connected to the selection line Ls through the contact hole HLa opened in the gate insulating film 12, has its source electrode Tr12s connected to the data line Ld through a contact hole HLc opened in the gate insulating film 12, and has its drain electrode T12d integrally formed with an electrode Ecb of the capacitor Cs at the other end thereof (closer to the node N12).

As shown in FIG. 3 to FIG. 5, the transistor Tr13 has its gate electrode Tr13g formed integrally with the electrode Eca of the capacitor Cs at the one end thereof (closer to the node N11), has its source electrode (conductive layer) Tr13s integrally formed with the electrode Ecb of the capacitor Cs at the other end thereof (closer to the node N12), and has its drain electrode Tr13d integrally formed with the supply voltage line Lz.

The capacitor Cs is formed such that its electrode Eca at the one end that is formed integrally with the gate electrode Tr13g of the transistor tr13 and its electrode Ecb at the other end that is formed integrally with the source electrode Tr13s spread while facing each other with the gate insulating film 12 interposed therebetween.

As shown in FIG. 5, a contact hole HLd is formed in the protective insulating film 13 and flattening film 14 above the source electrode Tr13s of the transistor Tr13 (above the electrode Ecb of the capacitor Cs), and the source electrode Tr13s and the pixel electrode 15 of the organic EL element OEL are electrically connected to each other through a metal material (contact metal MTL) filled in the contact hole HLd.

As shown in FIG. 3, FIG. 4, and FIG. 6, the selection line Ls extends on the gate insulating film 12, and is formed on the same layer as the supply voltage line La. The supply voltage line (anode line) La extends on the gate insulating film 12 likewise the selection line Ls, and is formed integrally with the drain electrode Tr11d of the transistor Tr11 and with the drain electrode Tr13d of the transistor Tr13.

And as shown in FIG. 5 and FIG. 6, an organic EL element is formed on the flattening film 14 of each pixel forming region Rpx, by sequentially stacking a pixel electrode 15 to serve as, for example, an anode electrode, an organic EL layer 16 including a positive hole transporting layer 16a and an electron-transporting light emitting layer 16b, and an opposing electrode 17 to serve as, for example, a cathode electrode. In the present embodiment, described is a display panel (organic EL panel) having a top-emission type light emitting structure for outputting light emitted from the organic EL layer 16 toward the opposite side to the insulating substrate 11 (through a sealing resin layer 19 and a sealing substrate 20, which are to be described later). Therefore, the pixel electrode 15 should have at least light reflectivity and the opposing electrode 17 should have light transmissivity, and the pixel electrode 15 has a stacked structure of a reflective conductive layer 15a on the lower level and an conductive oxide layer 15b on the upper level, as will be explained in a manufacturing method (see FIG. 7 to FIG. 10) described later.

A bank (partitioning wall) 18 for defining the regions where the organic EL elements OEL are formed (to be more precise, the regions where the organic EL layers 16 are formed) is formed along the column direction so as to project from the upper surface of the flattening film 14 between the pixel forming regions Rpx (in the boundary region between the regions where the organic EL elements OEL of the respective color pixels xr, Pxg, Pxb are formed). In the present embodiment, as shown in, for example, FIG. 5, the bank 18 comprises a base layer (first insulating layer) 18x on the lower level, a middle bank layer (second insulating layer) 18z on the middle level, and a bank metal layer (conductive layer) 18a on the upper level. The base layer 18x functions as an interlayer insulating film between the pixel forming regions Rpx. The middle bank layer 18z functions to improve the condition of adhesion of organic compound materials in forming the organic EL layer 16 (to improve the uniformity of the film thickness of the positive ole transporting layer 16a and electron-transporting light emitting layer 16b). The bank metal layer 18a is made of a conductive material and functions as the common voltage line (cathode line) Lc.

To be more specific, the base layer 18x is formed on the flattening film 14 near the boundary between adjoining color pixels Pxr, Pxg, Pxb, and partially extends over the pixel electrode 15 of the organic EL element OEL. The base layer 18x is made of silicon nitride film (SiN) or the like. The middle bank layer 18z is formed on the base layer 18x, and made of a resin material such as a polyimide-based one, an acrylic-based one, or the like. The bank metal layer 18a is made of a conductive material (e.g., a metal material) or the like, and formed on the middle bank layer 18z. The base layer 18x, the middle bank layer 18z, and the bank metal layer 18a are sequentially stacked in the thickness-wise direction. The base layer 18x is a layer for improving the adhesiveness between the flattening film 14 and the middle bank layer 18z, making it harder for the middle bank layer 18z to come off than a case without the base layer 18x. The middle bank layer 18z formed by hardening a photosensitive polyimide-based or acrylic-based resin material (Photoneece DL-1000 by Toray Industries, Inc.) is formed to have a smaller width than the base layer 18x such that the upper surface of the base layer 18x is partially exposed, and the bank metal layer (conductive layer) 18a is formed to have a smaller width than the middle bank layer 18z such that the upper surface of the middle bank layer 18z is partially exposed. It is preferred that the exposed width of the middle bank layer 18z be 1 μm or more, in order to take full advantage of the effect of the hydrophilic nature of the middle bank layer 18z to be described later.

Particularly, with the bank 18, which has the above-described stacked structure, placed over the display panel 10 (insulating substrate 11) to have a fence-like or lattice-like plan-view pattern as shown in FIG. 1, the pixel forming regions (the regions where the organic EL layers 16 of the organic EL elements OEL are formed) of the plurality of color pixels Pxr, Pxg, Pxb arrayed in the row direction (up and down direction of the drawing) are defined, and the bank metal layer 18a of the bank 18 can function as the wiring layer (common voltage line Lc) which can apply a predetermined voltage (common voltage Vcom) commonly to the respective color pixels Pxr, Pxg, Pxb (organic EL elements OEL) arrayed all over the display panel 10.

That is, by forming the opposing electrode (cathode electrode) 17 of the organic EL element OEL so as to spread over the bank 18 having the bank metal layer 18a and so as to contact the bank metal layer 18a to have electrical connection therewith as shown in FIG. 5, it is possible to make the bank 18 (bank metal layer 18a) function also as the common voltage line Lc.

A sealing substrate 20 formed of a glass substrate or the like is joined over the insulating substrate 11 on which the pixel drive circuit DC, the organic EL element OEL, and the bank 18 are formed, such that the sealing substrate 20 faces the insulating substrate 11 with a transparent sealing resin layer 19 interposed therebetween.

In this display panel 10, which has the pixel drive circuit DC including the function elements such as the transistors Tr11 to Tr13, the capacitor Cs, etc., and the wiring layers such as the selection line Ls, the data line Ld, the supply voltage line (anode line) La, etc., which are all formed on the lower-level layers (which are under a layer of the organic EL element OEL that is closest to the insulating substrate 11) of the display panel 10, a light emission drive current having a predetermined current value flows across the drain and source of the transistor Tr13 based on a gradation current Idata corresponding to display data supplied through the data line Ld, and is supplied to the pixel electrode 15 of the organic EL element OEL from the transistor Tr13 (source electrode Tr13s) through the contact hole HLd (contact metal MTL), thereby making the organic EL element OEL of the respective display pixels PIX (color pixels PXr, PXg, and PXb) emit light at a desired luminance gradation corresponding to the display data.

At this time, in a case where the display panel 10 shown in the present embodiment has light reflectivity (i.e., in the pixel electrode 15) and light transmissivity (i.e., in the opposing electrode 17) (that is, in a case where the organic EL element OEL is a top emission type), light emitted from the organic EL layer 16 of each display pixel PIX (color pixels PXr, PXg, PXb) is let out toward one surface side of the insulating substrate 11 (display panel 10) (upward in FIG. 5 and FIG. 6) directly through the opposing electrode 17 having light transmissivity or as reflected by the pixel electrode 15 having light reflectivity.

A display element (organic EL element) having the top-emission type light emitting structure has been explained in the present embodiment. However, the present invention is not limited to this, but can employ a display element having a bottom-emission type light emitting structure which lets out light emitted from the organic EL layer 16 toward the rear side of the insulating substrate 11 (display panel 10) (downward in FIG. 5 and FIG. 6) directly through the pixel electrode 15 having light transmissivity or by reflecting the light on the opposing electrode 17 having light reflectivity.

(Manufacturing Method of Display Device)

Next, a manufacturing method of the display device (display panel) described above will be explained.

FIG. 7 to FIG. 10 are cross sectional views observed in the manufacturing steps, which show one example of the manufacturing method of the display device (display panel) according to the present embodiment. Here, the manufacturing process of the panel structure having the A-A cross section shown in FIG. 5 will be explained. FIG. 11 show chemical symbols of the molecular structures of a coating material on the surface of the bank 18 formed on the display device (display panel 10) according to the present embodiment.

The manufacturing method of the display device (display panel 10) described above starts from, as shown in FIG. 7A, forming the transistors Tr11 to Tr13, the capacitor Cs, and the wiring layers such as the data line Ld, the selection line Ls, etc. which are included in the above-described pixel drive circuit DC (see FIG. 2 to FIG. 4), in the regions (pixel forming regions) Rpx where the display pixels PIX (color pixels PXr, PXg, and PXb) are to be formed, which regions are defined on one surface (upper surface in the drawing) of the insulating substrate 11 formed of a glass substrate or the like (see FIG. 5 and FIG. 6). Specifically, the gate electrodes Tr11g to Tr13g, the electrode Eca of the capacitor Cs at its one end, which is formed integrally with the gate electrode Tr13g, and the data line Ld (see FIG. 5) are formed simultaneously by patterning the same gate metal layer, and after this, the gate insulating film 12 is formed to cover the insulating substrate 11 entirely.

Next, the semiconductor layer SMC containing, for example, amorphous silicon, polysilicon, or the like is formed on the gate insulating film 12 so as to positionally correspond to the gate electrodes Tr11g to Tr13g, and the source electrodes Tr11s to Tr13s and the drain electrodes Tr11d to Tr13d are formed on both ends of the semiconductor layer SMC via the impurity layer OHM for ohmic connection. At this time, the electrode Ecb of the capacitor Cs at its other end, which is connected to the source electrode Tr13s and drain electrode Tr12d, and the supply voltage line La (see FIG. 6) connected to the drain electrodes Tr11d and Tr13d are formed simultaneously by patterning the same source/drain metal layer.

The source electrodes Tr11s to Tr13s and drain electrodes Tr11d to Tr13d of the transistors Tr11 to Tr13 described above, the electrode Ecb at the other end of the capacitor Cs, the selection line Ls, and the supply voltage line La may be made of not only pure aluminum, but, for example, alloy of aluminum in which a transition element metal such as neodymium, titanium, or the like is mixed, or may have a stacked structure in which a transition metal layer of chromium or the like is formed under a layer containing aluminum, with a view to reducing wiring resistance and reducing migration.

Then, as shown in FIG. 7B, the protective insulating film (passivation film) 13 made of silicon nitride (SiN) or the like is formed so as to entirely cover one surface of the insulating substrate 11 including the transistors Tr11 to Tr13, the capacitor Cs, the selection line Ls, and the supply voltage line La, and the flattening film 14 containing an organic material or the like is formed in order to flatten the surface on which the pixel electrode 15 to be described later is to be formed. After this, the flattening film 14 and the protective insulating film 13 are etched to form the contact hole HLd, through which the upper surface of the source electrode Tr13s of the transistor Tr13 (or the upper surface of the electrode Ecb at the other end of the capacitor Cs) is exposed.

Figure 8A:
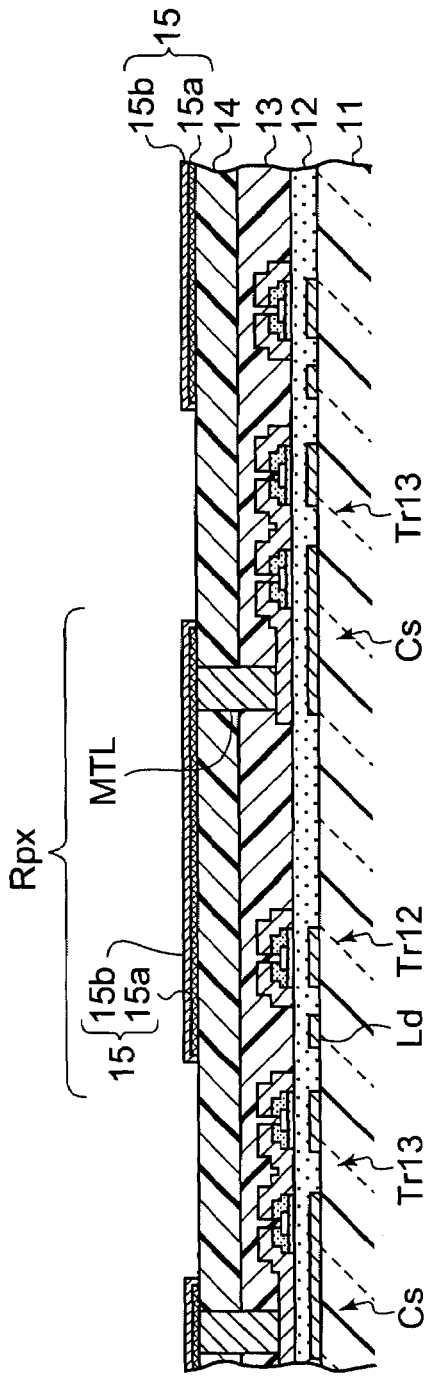
FIGS. 8A to 8C are cross-sectional diagrams of manufacturing steps (part 2) showing an example of the manufacturing method of the display device (display panel) according to the present embodiment.

Next, the contact metal MTL made of a metal material is filled in the contact hole HLd as shown in FIG. 7C, and then the pixel electrode 15 electrically connected to the contact metal MTL is formed in each pixel forming region Rpx (the region where each of the color pixels PXr, PXg, and PXb is formed) as shown in FIG. 8A.

Specifically, in this step of forming the pixel electrode 15, a reflective metal film having light reflectivity made of alloy of aluminum (Al), chromium (Cr), silver (Ag), silver palladium (AgPd), etc. is thinly formed, and the lower-level reflective conductive layer 15a, which is electrically connected to the contact metal MTL, is formed by pattering this thin film into a predetermined shape. After this, a metal oxide film made of a transparent electrode material (having light transmissivity) such as indium-tin-oxide (ITO), indium-zinc-oxide, or the like is thinly formed so as to entirely cover one surface of the insulating substrate 11 including the reflective conductive layer 15a, and the upper-level conductive oxide layer 15b is formed by patterning the thin film so as not to expose the upper surface and side surfaces of the reflective conductive layer 15a.

As described above, by patterning the upper-level conductive oxide layer 15b made of an metal oxide film so as not to expose the lower-level reflective conductive layer 15a, i.e., so as to maintain the cover by the conductive oxide layer 15b over the upper surface and side surfaces of the reflective conductive layer 15a having been patterned earlier, it is possible not to cause a cell reaction between the metal oxide film and the reflective conductive layer 15a, and to prevent the lower-level reflective conductive layer 15a from being excessively etched or damaged by etching. Further, since the conductive oxide film 15b has a rougher surface than non-oxidized metal having a smooth surface, it does not easily repel an organic compound containing liquid, which contains a charge transporting material to be described later, making it easier for the liquid to fit on the surface and for the charge transporting material to have a relatively uniform thickness.

Figure 8B:
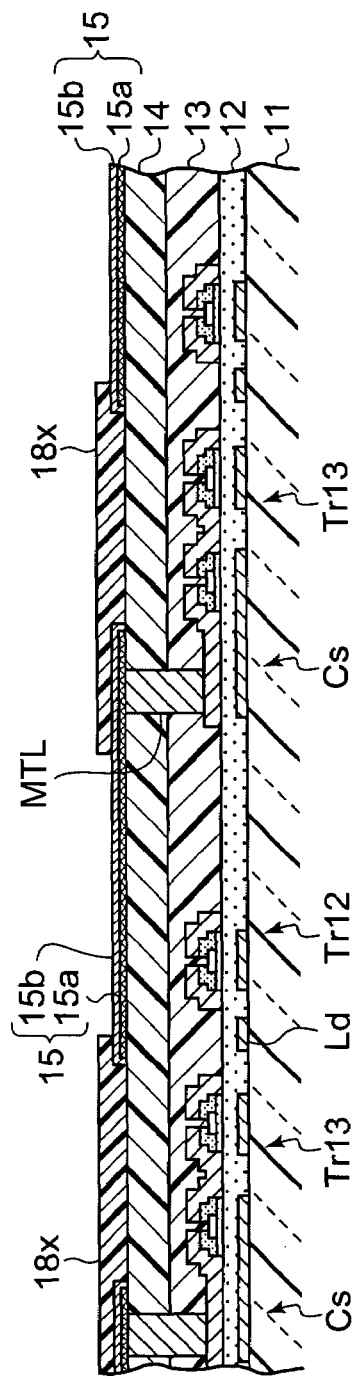

Next, by forming an insulating layer so as to entirely cover one surface of the insulating substrate 11 including the pixel electrode 15 comprising the reflective conductive layer 15a and the conductive oxide film 15b and then patterning the insulating layer, the base layer 18x to be the lowest layer of the bank 18 to be described later is formed in the column direction, in the region (i.e., the boundary region between adjoining display pixels PIX) between the pixel electrodes 15 formed in adjoining display pixels PIX, as shown in FIG. 5 and FIG. 8B. The base layer 18x is formed with the use of chemical vapor deposition (CVD) or the like, and made of an inorganic insulating material such as, for example, silicon oxide film, silicon nitride film, or the like, that has fine adhesiveness with an organic material contained in the flattening film 14 and with a material of the middle bank layer 18z to be described later. Since the base layer 18x is made of an inorganic insulating material such as silicon nitride film or the like, its thickness is set to 50 nm to 200 nm because a sufficient width would reduce the pattering accuracy of wet etching.

Figure 8C:
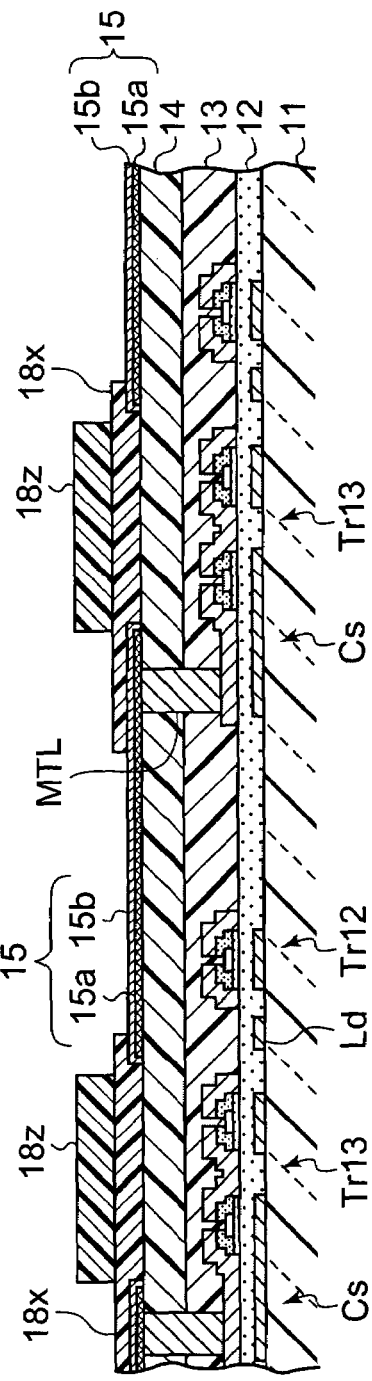

Then, as shown in FIG. 8C and FIG. 9A, the middle bank layer 18z is formed on the base layer 18x, by hardening a material, for example, a polyimide-based or acrylic-based photosensitive resin material, which has a higher lyophilicity to the solution (including dispersion liquid) which will constitute the organic EL layer 16 to be described layer than the silicon nitride film constituting the base layer 18x. Further, the bank metal layer 18a (supply voltage line Lc) that contains a metal material which has low resistance and whose surface at least is a non-oxidized conductive material made of any of copper (Cu), silver (Ag), gold (Au), platinum (Pt), and aluminum (Al), or alloy which mainly contains one or more of these metals, is formed on the middle bank layer 18z.

In a case where a photosensitive resin material is used for the middle bank layer 18z, first, a photosensitive resin film is formed so as to entirely cover one surface of the insulating substrate 11 including the base layer 18x. Then, the photosensitive resin film is exposed and developed, in a manner that it remains on the base layer 18x to have a predetermined pattern, thereby forming the middle bank layer 18z. Though described in detail layer, the middle bank layer 18z is formed to have a thickness of about 0.5 to 1.5 μm. Like this, the use of the photosensitive resin material as the middle bank layer 18z is preferable, because the middle bank layer 18z can be patterned with fine accuracy even if it is sufficiently thicker than the base layer 18x.

Further, the bank metal layer 18a is formed by forming a thin film made of the above-described metal material by sputtering or vacuum deposition, such that the thin film entirely covers one surface of the insulating substrate 11 including the base layer 18x and the middle bank layer 18z, and then applying photolithography to make the thin film remain on the middle bank layer 18z to have a predetermined pattern. Here, the bank metal layer 18a is formed to have a thickness of about 0.2 to 0.5 μm.

The bank metal layer 18a may be formed by forming a photoresist mask having an opening through which a portion of the upper surface of the middle bank layer 18z is exposed, and then by coating, drying, and sintering nanometal ink. It is preferred that conductive fine particles contained in the nanometal ink to constitute the bank metal layer 18a be a material excellent in resistance to corrosion, while it is preferred that the solvent contained in the nanometal ink be an organic solvent having a viscosity at which the conductive fine particles easily disperse, showing volatility at a relatively low temperature, having a high affinity for the surface of the middle bank layer 18z, and containing little moisture, and such a material may be, for example, pyrrolidone, etc.

As a result, the pixel forming regions (the regions where the organic EL layers 16 of the organic EL elements OEL are formed) of a plurality of display pixels PIX of the same color arrayed in the column direction of the display panel 10 are defined as surrounded by the bank 18 including the bank metal layer 18a, the middle bank layer 18z, and the base layer 18x, with the upper surface of the pixel electrodes 15 (conductive oxide layers 15b) exposed in the regions. The pixel electrodes 15 have their side edges along the column direction covered by the base layer 18x.

Next, after the insulating substrate 11 is cleaned with pure water, UV ozone treatment, oxygen plasma treatment, etc. are applied to impart lyophilicity to the surface of the pixel electrode 15 exposed in each pixel forming region Rpx defined by the bank 18, the base layer 18x exposed at the edges of the pixel electrode 15, and the surface of the middle bank layer 18z, and then to impart liquid repellency to the surface of the bank metal layer 18a.

"Liquid-repellent" used in the present embodiment is defined as describing a condition that a contact angle is 50 degrees or larger, when an organic compound containing liquid which contains a positive hole transporting material to be a later-described positive hole transporting layer, an organic compound containing liquid which contains an electron-transporting light emitting material to be an electron-transporting light emitting material, or an organic solvent used in these solutions is dropped onto an insulating substrate or the like, and the contact angle of the liquid or solvent is measured. "Lyophilic" in contrast with "liquid-repellent" is defined in the present embodiment as describing a condition that the contact angle is 40 degrees or smaller.

Specifically, liquid repellency impartment to the bank metal layer 18a is carried out as follows. First, the surface of the bank metal layer 18a is soft-etched by dipping the insulating substrate 111 having the above-described bank 18 formed on its one surface in an acid-based aqueous solution, cleaning the insulating substrate 11 with pure water, and drying it. Next, the insulating substrate 11 is dipped in a treatment tank containing a liquid repellency treatment solution which contains at least any of triazine-thiol compounds such as triazine-thiol or its derivative, fluorine-based triazine-thiol or its derivative, etc. In this treatment, the temperature of the liquid repellency treatment solution is set to, for example, about 20 to 50° C., and the dipping time is set to about 1 to 10 minutes. After this, the insulating substrate 11 is taken out from the liquid repellency treatment solution, and rinsed with a solvent such as alcohol or the like so that the liquid repellency treatment solution (triazine-thiol compound) remaining on the surface of the insulating substrate 11 is washed away. Then, the insulating substrate 11 is cleaned with pure water for the second time, and then dried by a blow of nitrogen gas ($N_2$).

At this time, the triazine-thiol compound selectively bonds with any of the metals on the surface of the bank metal layer 18a to form a coating film thereon, but does not coat the metal oxide (conductive oxide layer 15b) on the surface of the pixel electrode 15, the organic insulating film (photosensitive resin film) which forms the middle bank layer 18z, or the inorganic insulating film which forms the base layer 18x to such a degree to show liquid repellency. The film thickness of the triazine-thiol compound formed on the surface of the bank metal layer 18a is, for example, about 0.5 nm to 2.0 nm.

Figure 11A:
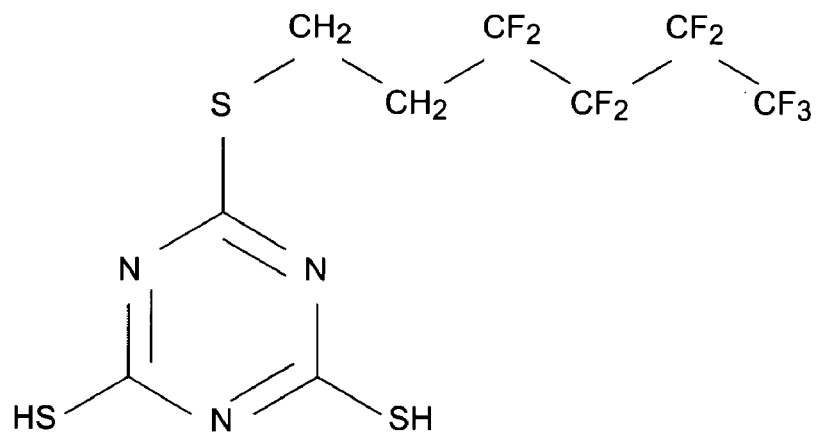
FIGS. 11A and 11B are chemical symbols showing a molecular structure of a coating material on the surface of a bank formed on the display device (display panel) according to the present embodiment.
Figure 11B:
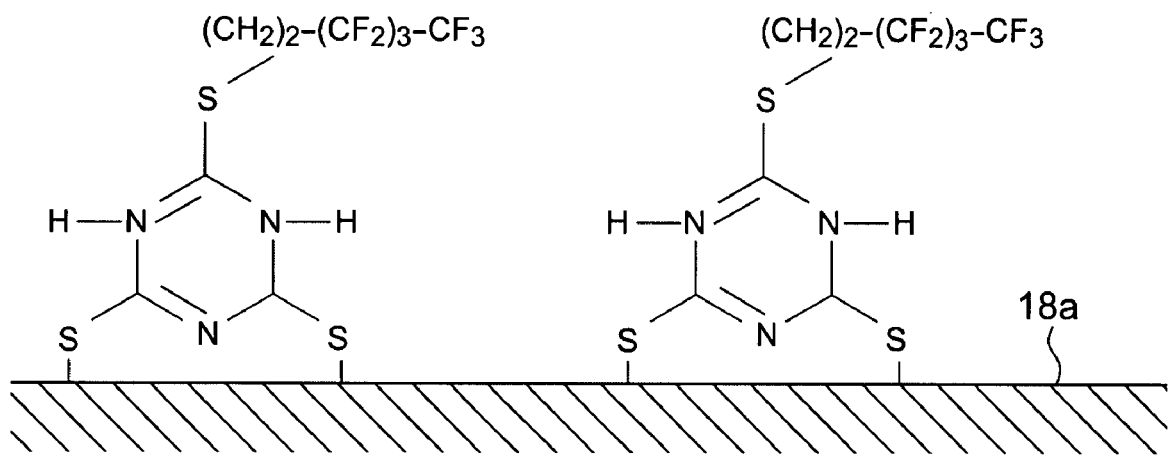

The triazine-thiol compound contains one thiol group or more to bond with metal, and regardless of whether it is a triazinetrithiol compound or a triazinedithiol compound, a fluorine-inclusive one is preferred to a fluorine-exclusive one because the former shows greater liquid repellency. That is, a fluorine-based triazine-thiol compound, which can be used as one example of a triazine-thiol compound, has such a molecular structure as shown in FIG. 11A, in which triazine (having a six-membered ring structure containing three nitrogen atoms) has thiol groups (—SH) bonding with its carbon atoms positioned between its nitrogen atoms at the first, third, and fifth positions, with a fluorinated alkyl group substituting for the hydrogen atom of one specific thiol group (—SH). A fluorinated alkyl group has a molecular structure, in which some or all hydrogen atoms of an alkyl group are substituted for by fluorine atoms, and shows greater liquid repellency as it includes more fluorine atoms. And as shown in FIG. 11B, since triazine-thiol, which itself shows liquid repellency, contains fluorine atoms which also show liquid repellency, the coating film formed on the surface of the bank metal layer 18a shows stronger liquid repellency than would be shown by triazine-thiol only. It is preferred that the liquid repellency treatment solution used in the above-described treatment be an aqueous solution in the range of about $1 \times 10^{-4}$ to $1 \times 10^{-2}$ mol/L, and sodium hydroxide or potassium hydroxide of an equal mole is added to the aqueous solution as additive.

There is no specific limitation on the number of carbon atoms in an alkyl group or a fluorinated alkyl group, as long as no distinctive steric barrier occurs. Further, the fluorine-based triazine-thiol compound may have only one of its thiol groups bond with metal while having the hydrogen radicals of the remaining two thiol groups substituted for by fluorinated alkyl radicals, or may have carbon atoms of any group that contains a fluorine atom form an olefin double bond with each other. Further, as another triazine-thiol derivative, for example, 6-dimethylamino-1, 3, 5-triazine-2,4-dithiol-sodium salt, or 6-didodecylamino-1,3,5-triazine-2,4-dithiol-sodium salt may be used, and dissolved in water to form a coating film.

As a result, the triazine-thiol compound forms a coating film only on the surface of the bank metal layer 18a containing metal materials, among the various elements formed on one surface of the insulating substrate 11, while it less easily adheres to the surface of the pixel electrode 15 covered with the conductive oxide layer (ITO or the like) 15b, the surface of the middle bank layer 18z and base layer 18x, and the flattening film 14 (or the protective insulating film 13) exposed between the pixel electrodes 15, resulting in poor coating over them. Accordingly, there appears on the single insulating substrate 11, a state that the surface of the bank metal layer 18a is only made liquid-repellent and the surface of the pixel electrode 15 exposed in each pixel forming region Rpx defined by the bank 18 is not made liquid-repellent.

Further, the pixel forming region Rpx of each display pixel PIX (organic EL element OEL) is separated from the pixel forming region Rpx of an adjoining display pixel PIX (organic EL element OEL) having a different color by the bank 18 defining the pixel forming regions Rpx. Therefore, even if forming a light emitting layer (electron-transporting light emitting layer 16b), which is to be the later-described organic EL layer 16, is by coating a solution (containing a dispersion liquid) of a light emitting material, light emitting materials do not mix between adjoining display pixels PIX (color pixels PXr, PXg, and PXb), preventing color mixture between adjoining color pixels.

Next, a solution of a positive hole transporting material or a liquid in which the positive hole transporting material is dispersed is coated over the pixel forming regions (the regions where the organic EL elements OEL are formed) of the respective colors at the same step, with the use of an ink jetting method for jetting a plurality of liquid drops independent from one another onto a predetermined position, a nozzle coating method for jetting a continuous flow of solution, or the like, then the solution is heated and dried to form the positive hole transporting layer 16a as show in FIG. 9B. Subsequently, a solution of an electron-transporting light emitting material or a liquid in which the electron-transporting light emitting material is dispersed is coated on the positive hole transporting layer 16a, and then heated and dried to form the electron-transporting light emitting layer 16b, as shown in FIG. 10A. As a result, the organic EL layer (light emitting function layer) 16 including the positive hole transporting layer 16a and the electron-transporting light emitting layer 16b is formed stacked.

Specifically, for example, polyethylenedioxithiophene/polystyrenesulfonate aqueous solution (PEDOT/PSS; a dispersion liquid obtained by dispersing polyethylenedioxithiophene PEDOT, which is a conductive polymer, and polystyrenesulfonate PSS as a dopant in a water solvent) is coated on the pixel electrode 15 (conductive oxide layer 15b) as an organic compound containing liquid which contains an organic high-molecular positive hole transporting material (charge transporting material). Thereafter, the stage on which the insulating substrate 11 is mounted is heated under a temperature condition of 100° C. or higher to dry the solution and remove residual solvent, thereby to fix the organic high-molecular positive hole transporting material on the pixel electrode 15 and form the positive hole transporting layer 16a as a charge transporting layer.

Here, since the pixel electrode 15, the base layer 18x at the edges of the pixel electrode 15, and the surface of the middle bank layer 18z have lyophilicity to the above-described organic compound containing liquid (PEDOT/PSS), the organic compound containing material coated in the pixel forming region Rpx defined by the bank 18 fits well to this region and spreads over the region (on the pixel electrode 15), and is attracted upward (pressed up) by a capillary tube phenomenon at the edges contacting the middle bank layer 18z.

Since this enables the vaporization of the solvent in the organic compound containing liquid, that starts immediately after the coating, to proceed while the organic compound containing liquid is drawn toward the edges, the uniformity of the film thickness of the positive hole transporting layer 16a formed on the pixel electrode 15 is improved. Further, since the surface of the bank metal layer 18a has liquid repellency to the above-described organic compound containing liquid (PEDOT/PSS), the organic compound containing material, which is pressed up, does not adhere well to the bank metal layer 18a and is therefore prevented from leaking or overleaping.

Then, for example, a solution obtained by dissolving a light emitting material which contains a conjugated double bond polymer such as polyparaphenylenevinylene, polyfluorene, etc. in an organic solvent such as tetraphosphor, tetramethylbenzene, mesitylene, xylene, etc. is coated on the positive hole transporting layer 16a as an organic compound containing liquid which contains an organic high-molecular electron-transporting light emitting material (charge transporting material). Thereafter, this solution is heated and dried on the aforementioned stage in a nitrogen atmosphere or by a sheathed heater in vacuum, to remove residual solvent, thereby to fix the organic high-molecular electron-transporting light emitting material on the positive hole transporting layer 16a and form the electron-transporting light emitting layer 16b, which is a charge transporting layer and also a light emitting layer.

In this case too, since the positive hole transporting layer 16a on the pixel electrode 15 is formed relatively flat by the middle bank layer 18z, and the surface of the middle bank layer 18z maintains lyophilicity to the above-described organic compound containing liquid, the organic compound containing liquid coated in the pixel forming region Rpx defined by the bank 18 fits well to this region (on the positive hole transporting layer 16a) and spreads over this region, and is attractive upward (pressed up) by a capillary tube phenomenon at the edges contacting the middle bank layer 18z.

Since this enables the vaporization of the solvent in the organic compound containing liquid, that starts immediately after the coating, to proceed while the organic compound containing liquid is drawn toward the edges, the film thickness of the electron-transporting light emitting layer 16b formed on the positive hole transporting layer 16a is improved. Further, since the surface of the bank metal layer 18a has water repellency to the above-described organic compound containing liquid, the organic compound containing liquid can be prevented from leaking or overleaping to adjoining pixel forming regions.

After this, a conductive layer (transparent electrode layer) having light transmissivity is formed on the insulating substrate 11 including at least the respective pixel forming regions Rpx to form the opposing electrode (e.g., a cathode electrode) 17, which faces the respective pixel electrodes 15 in common through the organic EL layer 16 (the positive hole transporting layer 16a and the electron-transporting light emitting layer 16b), as shown in FIG. 10B. Here, the opposing electrode 17 may have a film structure transparent in the thickness-wise direction, in which a thin film to serve as an electron injecting layer, made of a metal material such as calcium, indium, barium, magnesium, lithium, or the like is formed by, for example, vapor deposition, sputtering, or the like, and a transparent electrode layer made of ITO or the like is stacked thereon by sputtering or the like.

The opposing electrode 17 is formed as a single conductive layer that spreads not only over the region facing the pixel electrode 15 but over the bank 18 defining the pixel forming regions Rpx (the regions in which the organic EL elements OEL are formed), and is joined to the bank meta layer 18a constituting the bank 18 to have electrical connection with the bank metal layer 18a. The triazine-thiol compound coated over the surface of the bank metal layer 18a is very thin, and its presence between the opposing electrode 17 and the bank metal layer 18a does not hinder the continuity between them. This allows the bank metal layer 18a constituting the bank 18 to be used as the common voltage line (cathode line) Lc connected in common to the respective display pixels PIX. Like this, by placing the bank metal layer 18a having the same potential as the opposing electrode 17 between all the organic EL elements OEL, it is possible to reduce the sheet resistance of the cathode on the whole and to make the whole display panel 10 uniform in display characteristics.

Next, after the opposing electrode 17 is formed, the sealing layer 19 containing silicon oxide film, silicon nitride film, or the like is formed all over one surface of the insulating substrate 11 by using CVD or the like, as a protective insulating film (passivation film). Further, a sealing cover or the sealing substrate 20 is joined with the use of a UV-set or thermoset adhesive, thus completing the display panel 10 having the cross sectional structures shown in FIG. 5 and FIG. 6. Next, the workings and effects unique to the manufacturing method of the display device according to the present invention as described above will be verified, against a comparative example.

Figure 12:
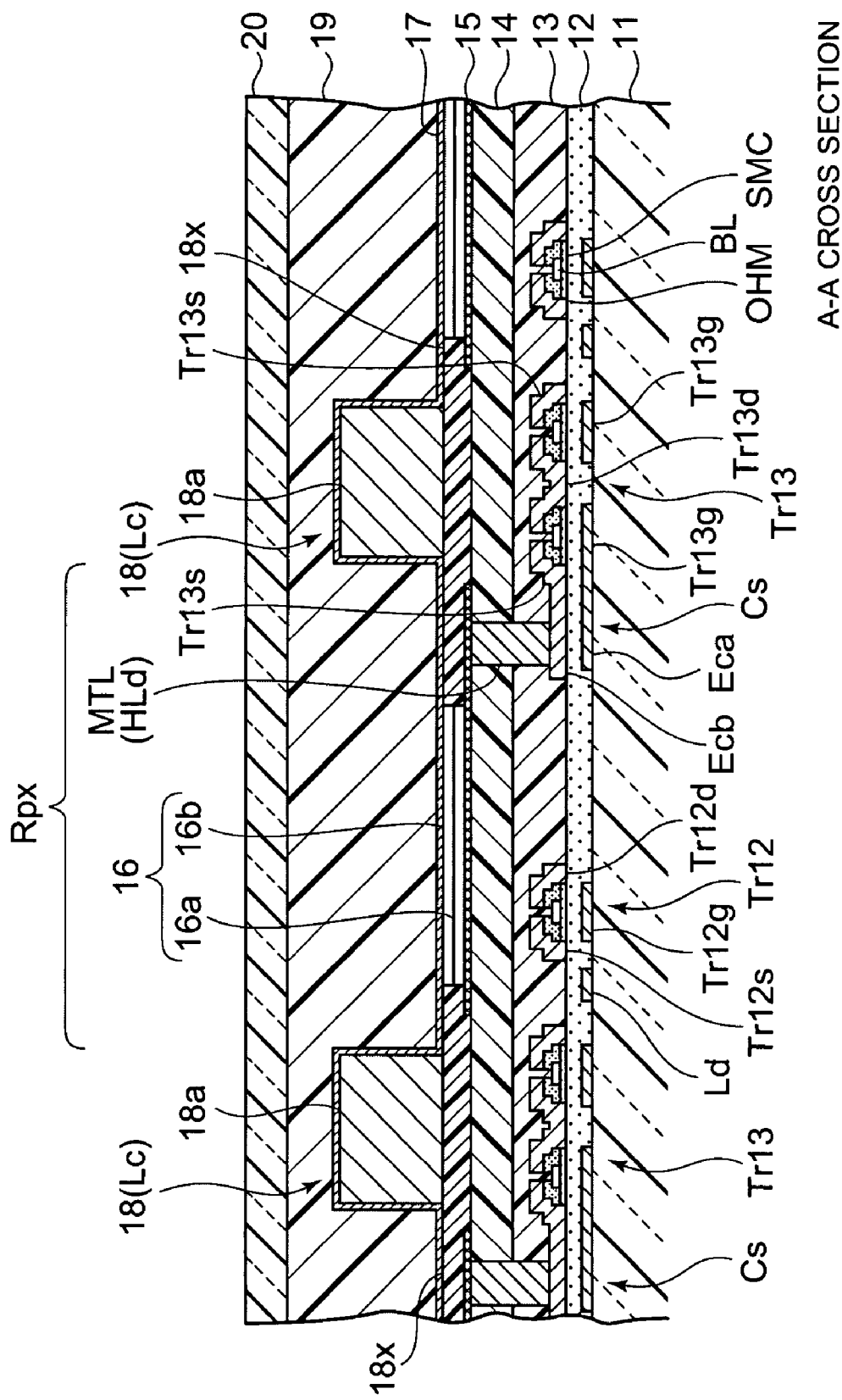
FIG. 12 is a schematic cross-sectional diagram showing a comparative example of a panel structure for explaining workings and effects unique to the manufacturing method of the display device according to the present invention.
Figures 13A, 13B:
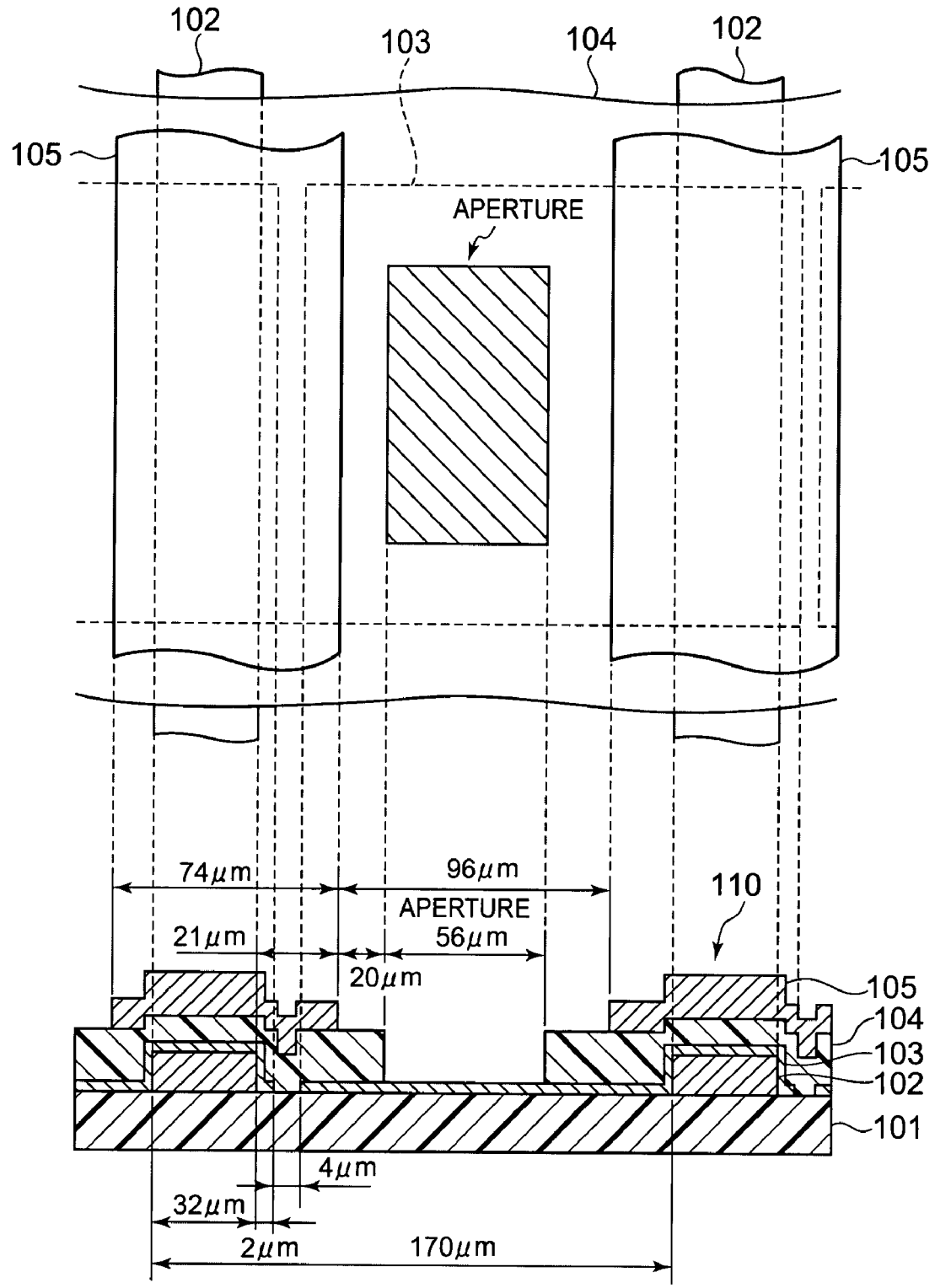
FIGS. 13A and 13B are a schematic plan view and a cross-sectional dimensional drawing showing specific values used for measuring the distribution (film thickness profile) of surface heights in the comparative example.
Figure 14:
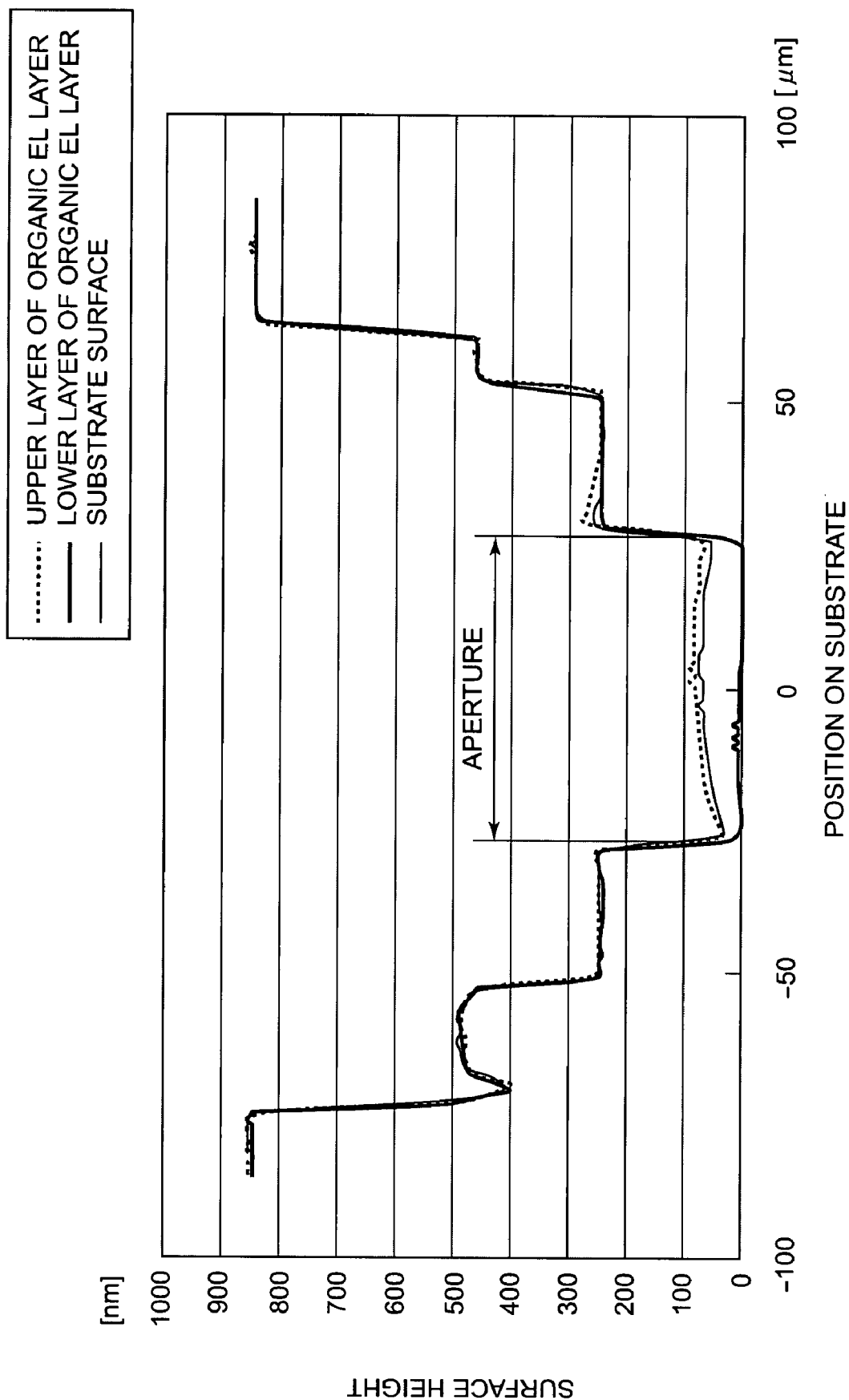
FIG. 14 is actual observation data showing the distribution (film thickness profile) of surface heights in the comparative example.

FIG. 12 is a schematic cross sectional diagram showing a comparative example of a panel structure for explaining the workings and effects unique to the manufacturing method of the display device according to the present invention. Any elements same as or similar to those of the cross-sectional structure shown in FIG. 5 will be denoted by the same reference numerals and explanation thereof will be omitted. FIGS. 13A and 13B are a schematic plan view and a cross-sectional dimensional drawing which show specific values used for measuring the distribution (film thickness profile) of the surface heights in the comparative example having the cross-sectional structure shown in FIG. 12. FIG. 14 is actual observation data showing the distribution (film thickness profile) of the surface heights in the comparative example having the cross-sectional dimensions shown in FIG. 13B. FIG. 13B shows cross-sectional dimensions, and FIG. 13A shows one example of a plan layout that corresponds to these cross-sectional dimensions. FIG. 13A applies hatching to an area where an conductive oxide layer (ITO) to serve as a pixel electrode is exposed, for the purpose of making the drawing easier to understand. FIG. 15 are conceptual diagrams showing changes of the state of the film surface of an organic EL layer (positive hole transporting layer) in its forming process according to the comparative example. FIG. 16 are conceptual diagrams showing changes of the state of the film surface of an organic EL layer (positive hole transporting layer) in its forming process according to the present embodiment.

First, the display panel according to the comparative example will be explained.

In the comparative example shown in FIG. 12, the bank 18 defining the pixel forming regions Rpx does not include the middle bank layer 18z and is formed of two layers, namely the base layer 18x on the lower level and the bank metal layer 18a on the upper level, in the panel structure (see FIG. 5) sectioned along the A-A line of the plan layout of the display pixel PIX shown in FIG. 3.

A simplified model of this display panel having such a panel structure (cross-sectional structure) was manufactured with the cross-sectional dimensions shown in FIGS. 13A and 13B, an organic EL layer (positive hole transporting layer) was formed thereon, and the distribution (film thickness profile) of the surface heights of this model was measured with the use of a probe stepmeter (Surf Coder ET4000 by Kosaka Laboratory Ltd.). The measured model has a specific cross-sectional structure as shown in FIGS. 13A and 13B, which comprises a glass substrate 101 (corresponding to the above-described insulating substrate 11), on which aluminum wirings 102 having a wiring width 32 μm are laid in parallel to have a wiring pitch of 170 μm, an ITO film 103 (corresponding to the conductive oxide layer 15b constituting the above-described pixel electrode 15) having a predetermined plan-view pattern is formed in the region between the aluminum wirings 102 to spread over the aluminum wiring 102 at one side (for example, the right side in the drawing), a silicon nitride film 104 (corresponding to the above-described base layer 18x) having a quadrangular aperture whose aperture width is 56 μm and from which the ITO film 103 is exposed in the region between the aluminum wirings 102 is formed so as to cover the entire glass substrate 101, and copper wirings 105 (corresponding to the above-described bank metal layer 18a) having a wiring width of 74 μm are formed on the silicon nitride film 104 correspondingly to where the aluminum wirings 102 are laid, so as to have a wiring pitch of 170 μm and a separation distance of 96 μm. With this structure, the region surrounded by a bank 110, which includes the silicon nitride film 104 and the wiring layers 105, is defied as a pixel forming region.

Likewise in the above-described embodiment, this model of display panel having such a cross-sectional structure was subjected to lyophilicization treatment for the surface of the ITO film (conductive oxide layer) 103 and silicon nitride film (base layer) 104, and to liquid repellency treatment for the surface of the copper wirings (metal bank layer) 105, and then an organic compound containing liquid which contains PEDOT/PSS to constitute the positive hole transporting layer was coated on the region (pixel forming region) surrounded by the bank 110, and then heated and dried. After this, the distribution of the surface heights of the positive hole transporting layer was measured at two points, which revealed a tendency that in any pattern, the film thickness at about the center of the region inside the aperture formed in the silicon nitride film 104 was large and the film thickness at the edges of the aperture where the positive hole transporting layer contacts the silicon nitride film 104 was small.

This is considered to be due to that the silicon nitride film 104 did not show sufficient affinity to the organic compound containing liquid in the lyophilicization treatment by UV ozone treatment while the ITO film, which is a conductive oxide layer, showed sufficient affinity to the organic compound containing liquid in the lyophilicization treatment by UV ozone treatment.

Figure 15A:
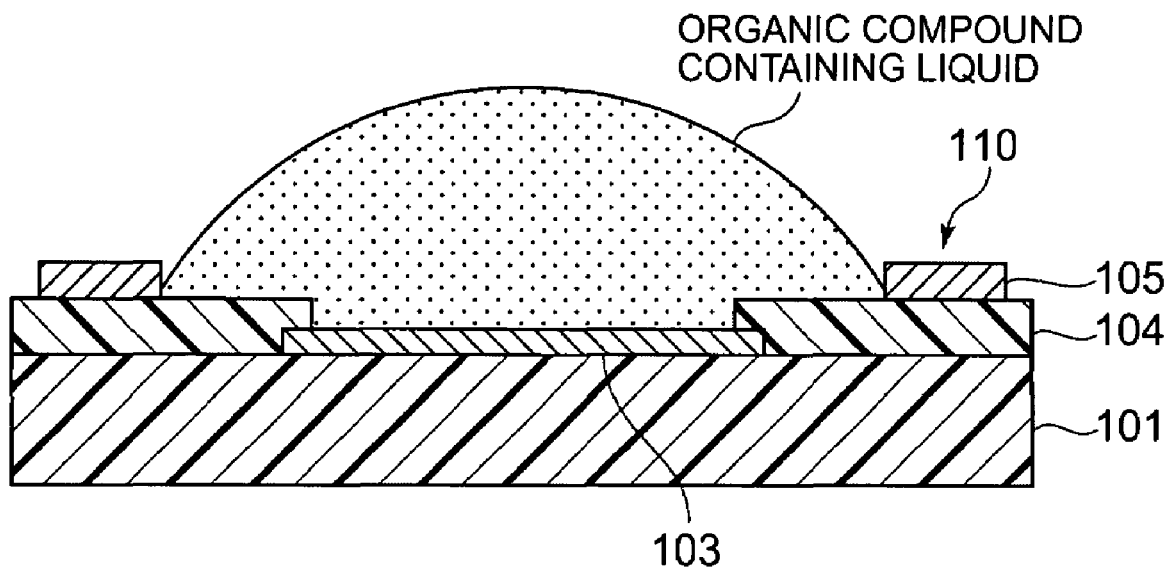
FIGS. 15A and 15B are conceptual diagrams showing changes of the state of the film surface of an organic EL layer (positive hole transporting layer) in the step of forming the layer in the comparative example.
Figure 15B:
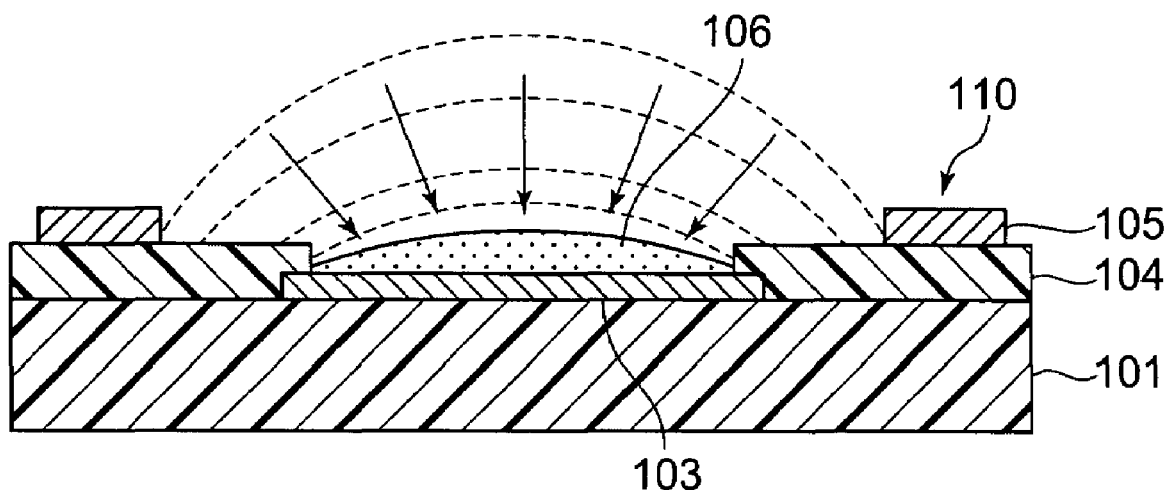

That is, in the process of forming the organic EL layer (positive hole transporting layer), the organic compound containing liquid coated on the pixel forming region defined by the bank 110 lands on the silicon nitride film 104 having lyophilicity to some degree but is repelled on the surface of the copper wirings 105 having liquid repellency, hereby staying in the region between the copper wirings 105 while having a dome-like cross-section, as shown in FIG. 15A.

If heating and drying are applied in such a state, since the organic compound containing liquid does not fit well to the surface of the silicon nitride film 104, the organic compound coagulates toward about the center of the aperture from which the ITO film having sufficient affinity to the organic compound containing liquid is exposed to make the film thickness there large while making the film thickness at the edges of the aperture small, thereby imparting an uneven film thickness to the organic EL layer (positive hole transporting layer) 106.

Figure 16A:
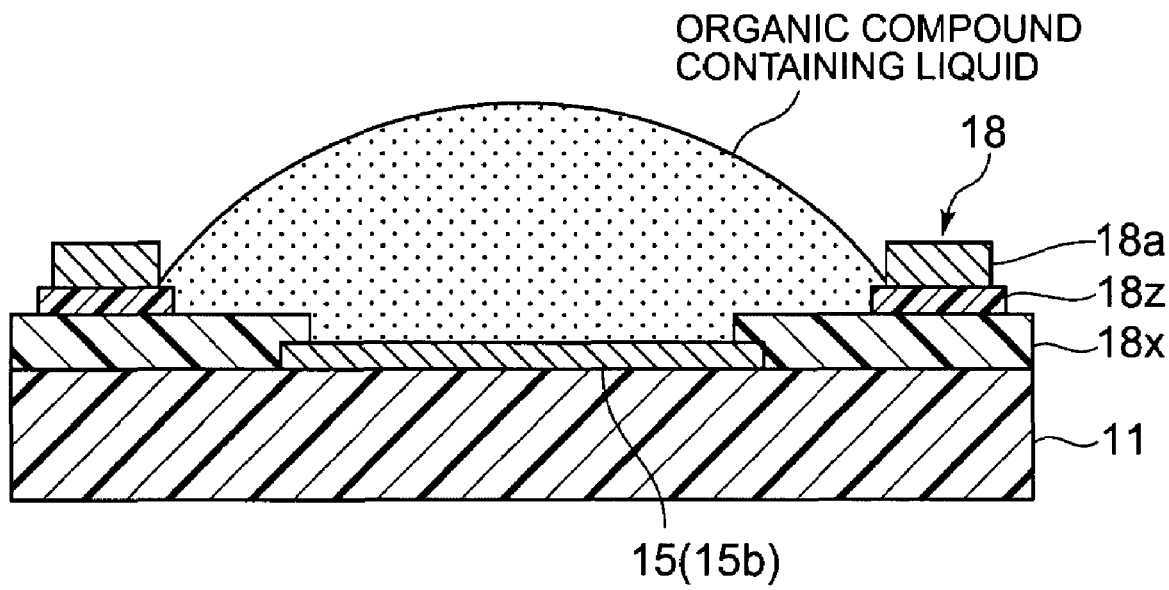
FIGS. 16A and 16B are conceptual diagrams showing changes of the state of the film surface of an organic EL layer (positive hole transporting layer) in the step of forming the layer in the present embodiment.
Figure 16B:
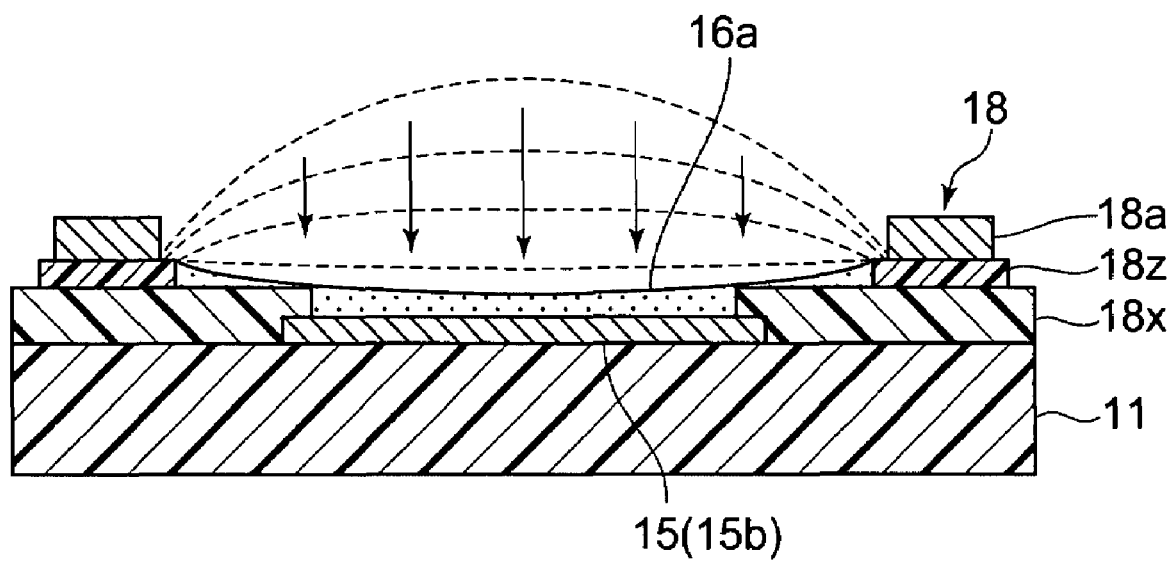

In contrast, in the present embodiment, the bank 18 has a stacked structure comprising the base layer 18x containing silicon nitride film, the middle bank layer 18z formed by hardening a photosensitive polyimide or acrylic-based resin material, and the bank metal layer 18a containing a metal material such as copper or the like, and a polyimide or acrylic-based resin material which shows higher affinity to an organic compound containing liquid than shown by the silicon nitride film constituting the base layer 18x is used to form the middle bank layer 18z. Therefore, the organic compound containing liquid coated on the pixel forming region fits well and spreads over the middle bank layer 18z having sufficient lyophilicity but is repelled on the surface of the bank metal layer 18a having liquid repellency, thereby staying in the region between the bank metal layers 18a while having a dome-like cross section as shown in FIG. 16A, likewise as shown in FIG. 15A.

If heating and drying are applied in such a state, since the organic compound containing liquid fits well and spreads over the surface of the middle bank layer 18z formed by hardening a polyimide or acrylic-based resin material, drying proceeds with the liquid surface of the organic compound containing liquid drawn to the edges, thereby preventing coagulation of PEDOT/PSS in the organic compound toward the center of the aperture to make the film thickness uniform generally all over the surface and impart a uniform film thickness to the organic EL layer 16 (positive hole transporting layer 16a), as revealed.

It was also revealed that if the film thickness of the middle bank layer 18a is made too large, the amount of the organic compound which spreads over the surface of the middle bank layer 18z in the heating and drying process increases and the liquid surface is excessively drawn to the edges, thereby reversely making the film thickness at about the center of the aperture small and making the film thickness of the positive hole transporting layer 16a uneven.

Hence, as the result of the inventor's committed investigation, it was confirmed that in order for the middle bank layer 18z to have a step height enough for the organic compound in the organic compound containing liquid to fit and spread thereon, and in order for the middle bank layer 18z to be formed to have a width which can be possessed by a resin film while securing uniformity of the film thickness of the positive hole transporting layer, the film thickness of the middle bank layer 18z should preferably be about 0.5 to 1.5 μm, the contact angle of pure water on the surface of the middle bank layer 18z should preferably be 10 degrees or smaller, the dimension by which the middle bank layer 18z is drawn out (exposed) from the end of the bank metal layer 18a should preferably be 1 μm or larger, and the dimension by which the base layer 18x is drawn out (exposed) from the end of the middle bank layer 18z should preferably be 1 μm or larger.

As explained above, according to the display device and the manufacturing method thereof according to the present embodiment, the stacked structure comprising the base layer containing silicon nitride film or the like, the middle bank layer containing a polyimide or acrylic-based resin film, and a metal bank layer whose surface at least contains copper or the like is used as the bank for defining the pixels (pixel forming regions), and the surface of the pixel electrode (metal oxide film made of ITO or the like) exposed in the aperture and the surface of the middle bank layer are imparted with lyophilicity while the surface of the metal bank layer is imparted with liquid repellency to make the organic compound containing liquid (PEDOT/PSS, or the like), which is to constitute the organic EL layer (positive hole transporting layer), fit well and spread over the surface of the middle bank layer and be dried with its liquid surface drawn. Therefore, there is formed an organic EL layer (light emitting function layer), whose film thickness is uniform generally all over the region of the aperture from which the pixel electrode is exposed.

Therefore, according to the present embodiment, it is possible to achieve a desired display quality by preventing the light emission start voltage in the light emitting operation and the wavelength (chromaticity) of the light emitted from the organic EL layer from straying from the aimed values, and to realize a display panel excellent in reliability and longevity by preventing deterioration of the organic EL element.

In the above-described verification in contrast with the comparative example, explained is a case that the positive hole transporting layer 16a is formed by coating PEDOT/PSS as the organic compound containing liquid on the ITO film (conductive oxide layer) which functions as the pixel electrode. The present invention is not limited to this case, but it was confirmed that the same workings and effects can be achieved also when the electron-transporting light emitting layer 16b is formed on the positive hole transporting layer 16a. Further, the same effects can be expected even if the pixel electrode is made of any other transparent metal oxide than ITO.

In the above-described embodiment, a case has been explained, in which the organic EL layer 16 comprises the positive hole transporting layer 16a and the electron-transporting light emitting layer 16b. The present invention is not limited to this, but the organic EL layer 16 may comprise only a dual-functional positive-hole-transporting/electron-transporting light emitting layer, or comprise a positive-hole-transporting light emitting layer and an electron transporting layer, or arbitrarily comprise a charge transporting layer in-between, or comprise a combination of any other charge transporting layers.

In the above-described embodiment, the pixel electrode 15 is an anode. This is not the only case, but the pixel electrode 15 may be a cathode. In this case, the charge transporting layer of the organic EL layer 16, which contacts the pixel electrode 15, needs to be an electron transporting layer.

In the above-described embodiment, the pixel electrode 15 has a dual-layered structure comprising the reflective conductive layer 15a and the conductive oxide layer 15b, but may only comprise the reflective conductive layer 15a as long as the reflective conductive layer 15a has fine adhesiveness and fine charge injecting property with respect to the organic layer (e.g., a positive hole transporting layer) and can be formed so as to impart a relatively uniform thickness to the organic compound containing liquid, when the organic compound containing liquid which contains a charge transporting material is coated on the upper surface thereof.

As apparent from the above, according to the display device and the manufacturing method thereof according to the present invention, it is possible to realize a display panel on which formed is a charge transporting layer having a film thickness with improved uniformity generally all over the region where each pixel is formed.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2006-131002 filed on May 10, 2006 and including specification, claims, drawings and summary. The disclosure of the above Japanese Patent Application is incorporated herein by reference in its entirety.

What is claimed is:

1. A manufacturing method of a display device, comprising:
    a step of forming a first insulating layer which surrounds a pixel electrode;
    a step of forming a second insulating layer on the first insulating layer;
    a step of forming a conductive layer on the second insulating layer;
    a step of imparting lyophilicity to a surface of the pixel electrode and a surface of the second insulating layer;
    a step of imparting liquid repellency to a surface of the conductive layer; and
    a step of coating a solution containing a charge transporting material on the pixel electrode, such that the solution comes in contact with the first insulating layer, the second insulating layer and the conductive layer.

2. The manufacturing method according to claim 1, wherein the second insulating layer is formed by hardening a photosensitive polyimide-based or acrylic-based resin material.

3. The manufacturing method according to claim 1, wherein the step of imparting lyophilicity includes a step of applying UV ozone treatment or oxygen plasma treatment to the surface of the pixel electrode and the second insulating layer.

4. The manufacturing method according to claim 1, wherein before liquid repellency is imparted to the surface of the conductive layer, the surface of the conductive layer is soft-etched.

5. The manufacturing method according to claim 1, wherein the surface of the conductive layer is soft-etched with an acid-based aqueous solution.

6. The manufacturing method according to claim 1, wherein the step of imparting liquid repellency includes a step of imparting liquid repellency to the surface of the conductive layer by coating a film made of a triazine-thiol compound on the surface of the conductive layer.

* * * * *

UNITED STATES PATENT AND TRADEMARK OFFICE
CERTIFICATE OF CORRECTION

PATENT NO.        : 7,695,759 B2
APPLICATION NO.   : 11/800842
DATED             : April 13, 2010
INVENTOR(S)       : Minoru Kumagai It is certified that error appears in the above-identified patent and that said Letters Patent is hereby corrected as shown below:

Column 20, Line 37, (Claim 5, Line 1);

Change "1" to --4--.

Signed and Sealed this

Twenty-sixth Day of October, 2010

David J. Kappos
*Director of the United States Patent and Trademark Office*